(12) United States Patent
Maruyama et al.

(10) Patent No.: US 8,766,659 B2
(45) Date of Patent: Jul. 1, 2014

(54) CONTACTOR INCLUDING A COVALENT BOND LAYER

(75) Inventors: Shigeyuki Maruyama, Yokohama (JP); Yoshihiro Sekizawa, Yokohama (JP); Tomohiro Suzuka, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 357 days.

(21) Appl. No.: 13/033,796

(22) Filed: Feb. 24, 2011

(65) Prior Publication Data

US 2011/0212551 A1    Sep. 1, 2011

(30) Foreign Application Priority Data

Feb. 26, 2010   (JP) .................................. 2010-41700

(51) Int. Cl.
*G01R 1/067* (2006.01)
*G01R 31/20* (2006.01)

(52) U.S. Cl.
USPC ............. 324/755.01; 324/754.03; 324/755.03

(58) Field of Classification Search
None
See application file for complete search history.

(56) References Cited

U.S. PATENT DOCUMENTS

| | | | | |
|---|---|---|---|---|
| 5,225,771 A | * | 7/1993 | Leedy ...................... | 324/755.04 |
| 5,280,236 A | * | 1/1994 | Takahashi et al. ........ | 324/755.01 |
| 6,198,300 B1 | * | 3/2001 | Doezema et al. ........ | 324/755.07 |
| 6,812,723 B2 | | 11/2004 | Mikami | |

FOREIGN PATENT DOCUMENTS

| | | |
|---|---|---|
| JP | 2002-131334 A | 5/2002 |
| JP | 2007-155553 A | 6/2007 |

* cited by examiner

*Primary Examiner* — Vinh Nguyen
(74) *Attorney, Agent, or Firm* — Fujitsu Patent Center

(57) ABSTRACT

A contactor includes a contactor base material including a first material and a conductor film including a second material. The conductor film is formed only on a contact surface with an electrode of a semiconductor apparatus at a tip of the contactor film.

7 Claims, 37 Drawing Sheets

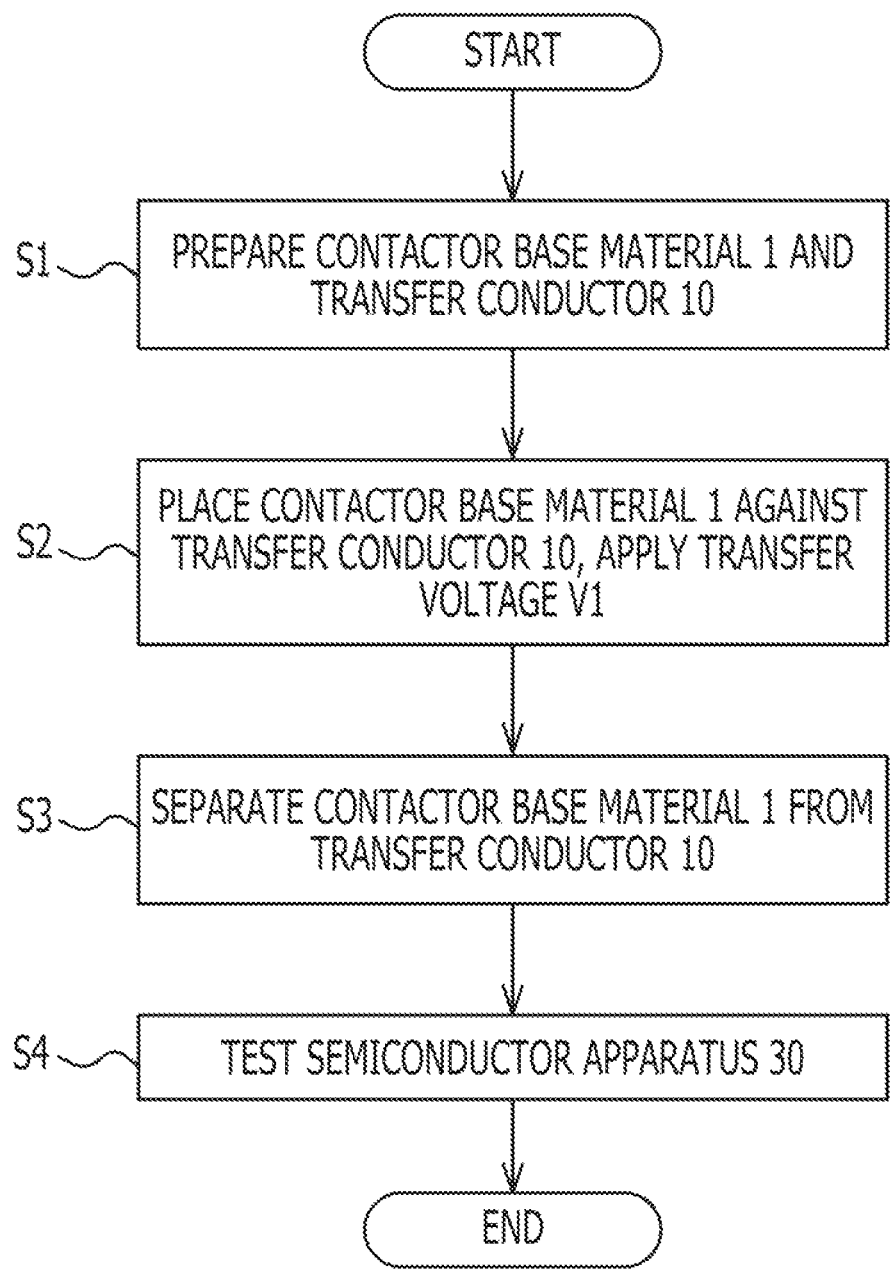

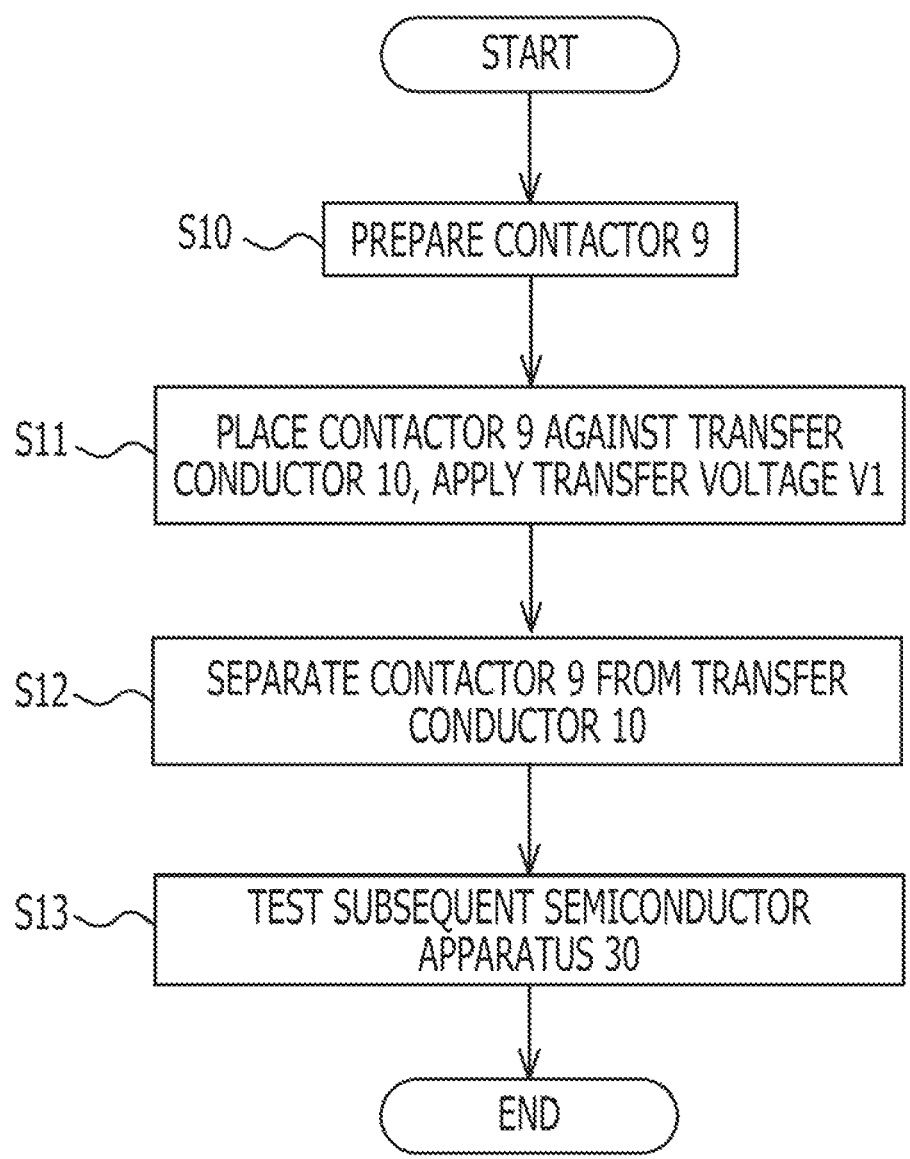

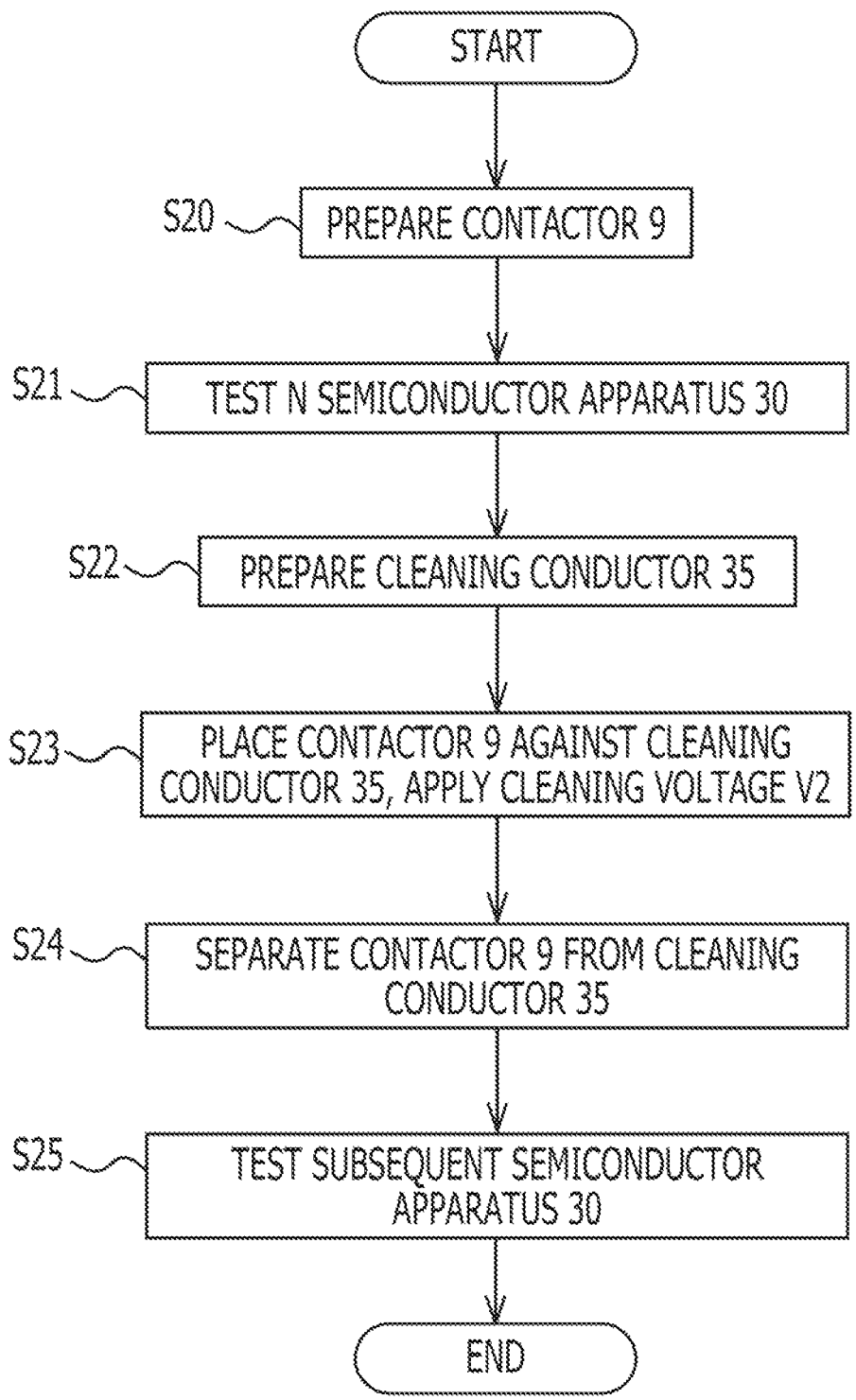

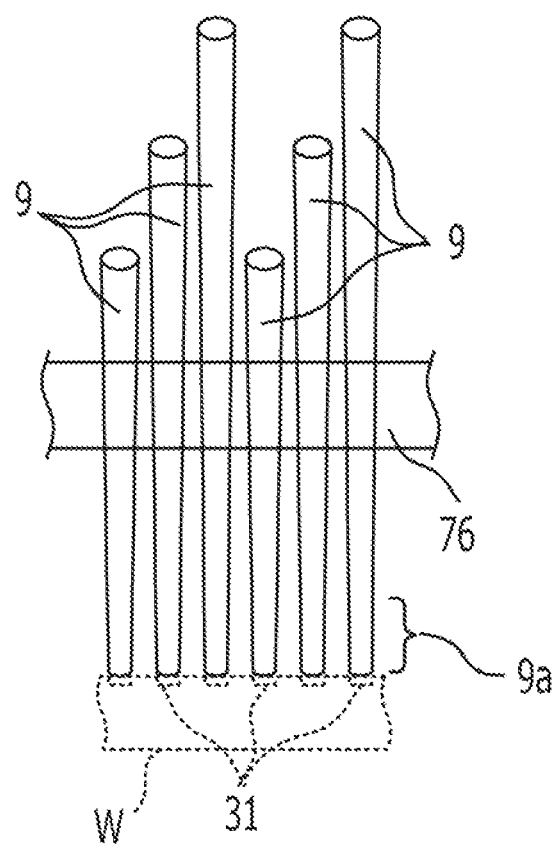

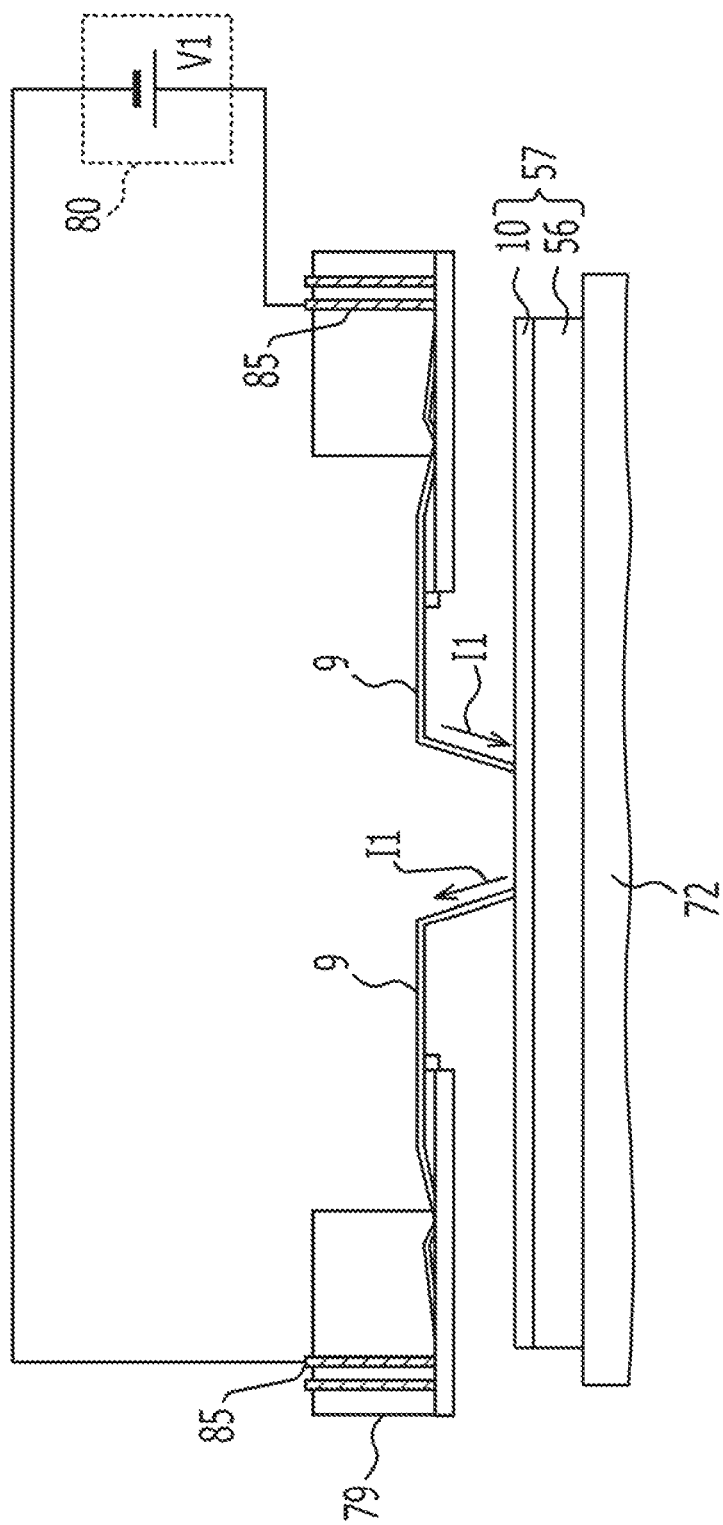

CONTACTOR INCLUDING A COVALENT BOND LAYER

CROSS-REFERENCE TO RELATED APPLICATIONS

This application claims the benefit of priority from Japanese Patent Application No. 2010-41700 filed on Feb. 26, 2010, the entire contents of which are incorporated herein by reference.

BACKGROUND

1. Field

Embodiments discussed herein relate to a contactor, a test device for a semiconductor apparatus, and a semiconductor apparatus fabrication method.

2. Description of Related Art

During a fabrication process of a semiconductor apparatus, electrical tests are conducted to the semiconductor apparatus in order to check whether or not the semiconductor apparatus has particular functions. Such tests include tests at the wafer level and tests after packaging. During these tests, a test signal is supplied to the semiconductor apparatus by contacting conductive needles such as contactors to electrodes of the semiconductor apparatus.

Related art is disclosed in Japanese Laid-open Patent Publication No. 2007-155553.

SUMMARY

According to one aspect of the embodiments, a contactor includes: a contactor base material including a first material; and a conductor film including a second material, the conductor film being formed only on a contact surface with an electrode of a semiconductor apparatus at a tip of the contactor film.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 1 illustrates an exemplary test method;
FIG. 11 illustrates an exemplary test method;
FIG. 15 illustrates an exemplary test method;
FIG. 29 illustrates an exemplary contactor;
FIG. 32 illustrates an exemplary contactor.

DESCRIPTION OF EMBODIMENTS

In electrical tests, contactors may be worn away as a result of repeated contact between contactors and electrodes, whereby increasing the contact resistance between contactors and electrodes.

As a result of contact, the material of an electrode pad accumulates on tips of contactors as foreign matter, and the contact resistance between contactors and electrodes may increase due to oxidation of this foreign matter.

In order to reduce the contact resistance based on the accumulation of foreign matter, tin, which is softer than other parts of the contactors, is selectively deposited onto the tip of contactors.

Figure 2A:
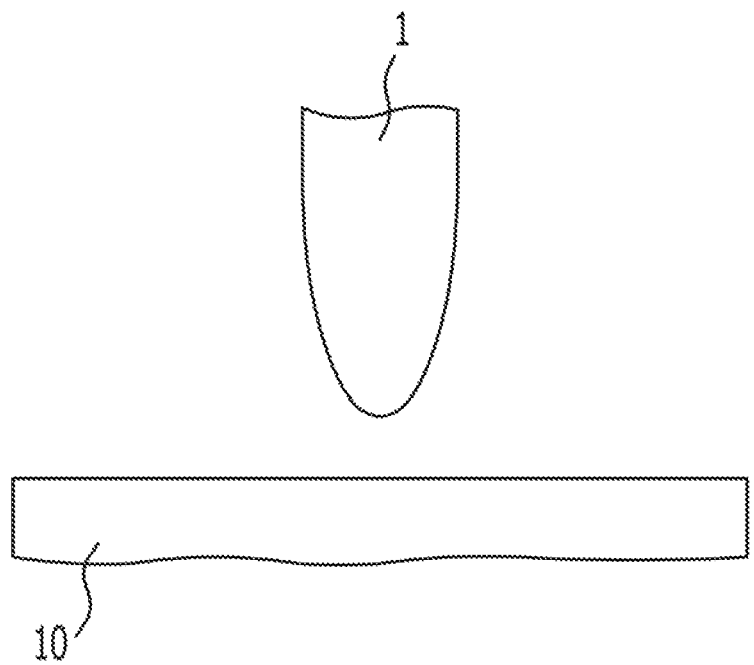
FIGS. 2A and 2B illustrate an exemplary test method.

FIGS. 1 to 3 illustrate an exemplary test method. In an operation S1, a needle-like contactor base material 1 and a transfer conductor 10 are prepared, as illustrated in FIG. 2A.

The material used for the contactor base material 1 is arbitrary. A beryllium copper alloy or tungsten may be used in order to increase the elasticity or conductivity of the contactor base material 1.

Iron may also be used as the material of the contactor base material 1 in order to increase the wear resistance or hardness of the contactor base material 1.

Copper may also be used as the material of the contactor base material 1.

Figure 2B:
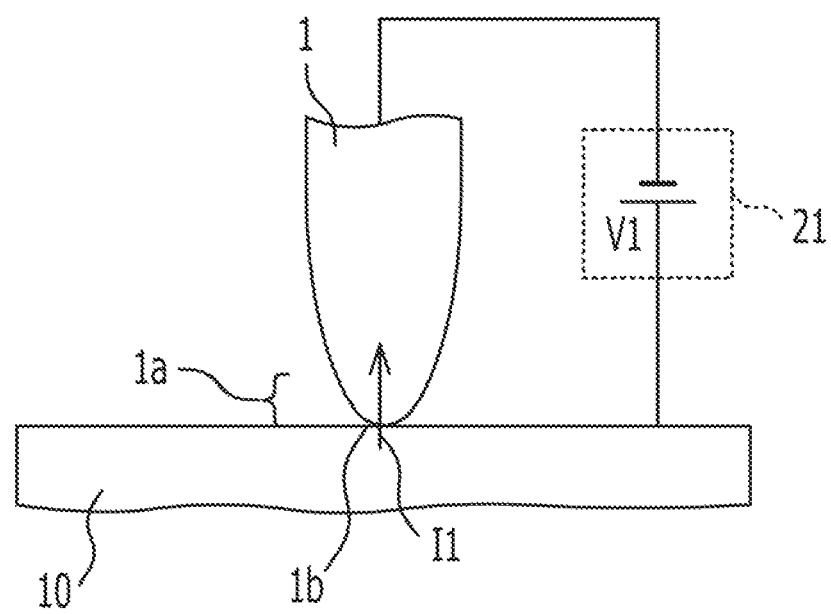

In an operation S2, the tip 1a of the contactor base material 1 is placed against the surface of the transfer conductor 10, as illustrated in FIG. 2B.

A first voltage generator 21 generates a transfer voltage V1. One of the poles of the transfer voltage V1 is coupled to the transfer conductor 10, while the other pole is coupled to the contactor base material 1.

A current I1 flows between the contactor base material 1 and the transfer conductor 10. The current I1 promotes electron movement in the respective materials of the contactor base material 1 and the transfer conductor 10, thereby forming covalent bonds between the materials.

The polarity of the transfer voltage V1 may be arbitrary. For example, the voltage may be applied while alternating the positive and negative poles.

Figure 3A:
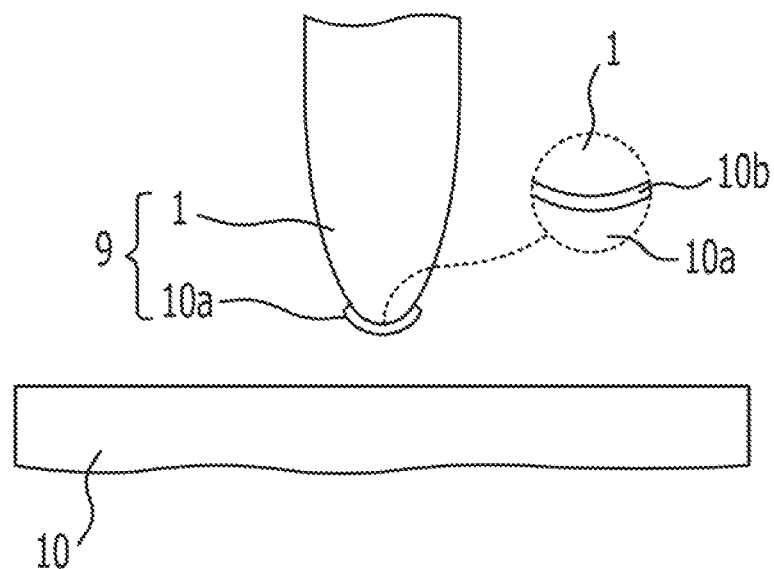
FIGS. 3A and 3B illustrate an exemplary test method.

In an operation S3, the contactor base material 1 is separated from the transfer conductor 10, as illustrated in FIG. 3A. At this point, since the material of the contactor base material 1 and the material of the transfer conductor 10 are joined by covalent bonds, some of the transfer conductor 10 is transferred to the tip of the contactor base material 1 as a conducting film 10a. As a result, a contactor 9 including the conducting film 10a and the contactor base material 1 is obtained.

As illustrated inside the broken circle in FIG. 3A, a covalent bond layer 10b is formed between the conducting film 10a and the contactor base material 1 by the current I1. The covalent bond layer 10b includes the respective materials of the transfer conductor 10, which is formed by the current I1, and the contactor base material 1. The covalent bond layer 10b may be thinner than the conducting film 10a.

The process proceeds to operation S4.

Figure 3B:
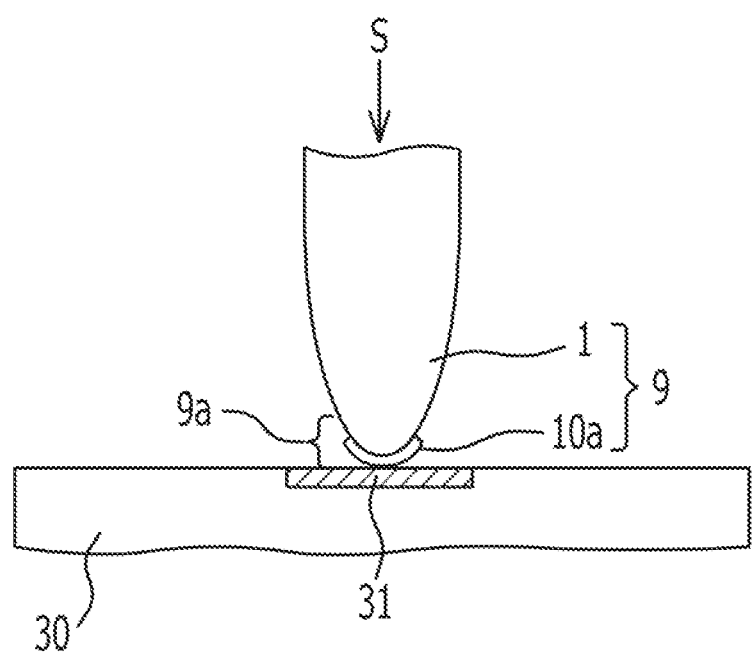

As illustrated in FIG. 3B, a semiconductor apparatus 30 to be measured is prepared in an operation S4.

The tip of the contactor 9 is made to contact the electrode 31 of the semiconductor apparatus 30, and a test signal S is supplied to the contactor 9. The semiconductor apparatus 30 is electrically tested.

Since the conducting film 10a has been formed on the tip 9a of the contactor 9, the contactor base material 1 may not directly contact the electrode 31. For this reason, wear on the contactor base material 1 due to contact with the electrode 31 may be reduced, and the contact resistance between the contactor 9 and the electrode 31 due to wear may be reduced, even after repeating the tests.

As illustrated in FIG. 2B, the conducting film 10a is formed by the transfer voltage V1 being applied between the contactor base material 1 and the transfer conductor 10. When the transfer voltage V1 is applied, only the tip 1a of the contactor base material 1 contacts the transfer conductor 10, and thus the conducting film 10a may be formed only on a portion of the tip 1a, for example, the contact surface 1b with the electrode 31 of the semiconductor apparatus 30.

Since the conducting film 10a may not be formed on the portions of the contactor 9 that do not contact the electrode 31, the thickness of the contactor 9 may not be increased.

Since the test device forms the conducting film 10a by applying the transfer voltage V1 illustrated in FIG. 2B during the test line of the semiconductor apparatus, heating or melting equipments for depositing the conducting film 10a may not be provided.

The material of the transfer conductor 10 may also include gold in order to lower the resistance of the conducting film 10a.

The transfer conductor 10 may also include a material with a smaller affinity for the electrode 31 than gold in order to reduce the adhesion of electrode 31 material onto the contactor 9 when the semiconductor apparatus 30 is tested as illustrated in FIG. 3B.

The affinity between the two types of material may be determined by their covalent bond radii. For example, as the difference in the covalent bond radii decreases between a given material and another material, the given material and the other material become more strongly joined by covalent bonds, and the affinity may increase. As the difference in the covalent bond radii increases between the materials, covalent bonding between the materials becomes difficult, and the affinity may decrease.

When the material of the electrode 31 includes aluminum, tin, or lead, the difference in the covalent bond radii is large between the material of the electrode 31 and Group 3 to Group 10 elements as compared to gold. For this reason, the affinity with the electrode 31 may decrease.

When the material of the transfer conductor 10 includes one of the Group 3 to Group 10 elements or alloys thereof, the adhesion of electrode 31 material onto the contactor 9 may decrease compared to when the material of the transfer conductor 10 includes gold. The Group 3 to Group 10 elements may have a small electrical resistance.

Among the Group 3 to Group 10 elements, the Group 8 to Group 10 elements may have particularly small electrical resistance.

Group 8 to Group 10 elements and their alloys include platinum, nickel, palladium, and palladium-cobalt alloys, for example.

When the same material is included in the material of the transfer conductor 10 and the material of the electrode 31, the conducting film 10a includes electrode material, and thus the conducting film 10a may oxidize more readily. For this reason, the material of the transfer conductor 10 may also include materials other than the material included in the electrode 31.

The respective hardness values of the covalent bond layer 10b, the conducting film 10a, and the contactor base material 1 are determined by their materials.

For example, when the material of the conducting film 10a includes gold and the material of the contactor base material 1 includes a beryllium copper alloy, the hardness of the covalent bond layer is strongest, the hardness of the contactor base material 1 is strong secondly, and the hardness of the conducting film 10a is strong thirdly.

When the material of the conducting film 10a includes platinum and the material of the contactor base material 1 includes copper, the hardness of the covalent bond layer 10b is strongest, the hardness of the conducting film 10a is strong secondly, and the hardness of the contactor base material 1 is strong thirdly.

The voltage value of the transfer voltage V1 illustrated in FIG. 2B may be arbitrary. The transfer voltage V1 may be higher than the maximum voltage of the test signal S, in order to form the conducting film 10a on the contactor 9 in a short amount of time.

When the transfer voltage V1 is high, the current I1 flowing between the contactor 9 and the transfer conductor 10 increases, and the conducting film 10a may be formed on the contactor 9 in a short amount of time.

When the transfer voltage V1 is a pulse voltage, the current I1 flows intermittently, and thus the heating of the contactor 9 by the Joule heat accompanying the current I1 might be reduced as compared to when the transfer voltage V1 is a DC voltage.

For example, when a pulse voltage with a 1000 ms pulse width and 500 ms interval is used as the voltage, the pulse voltage may be applied between the contactor 9 and the transfer conductor 10 for 10 cycles.

Figure 4:
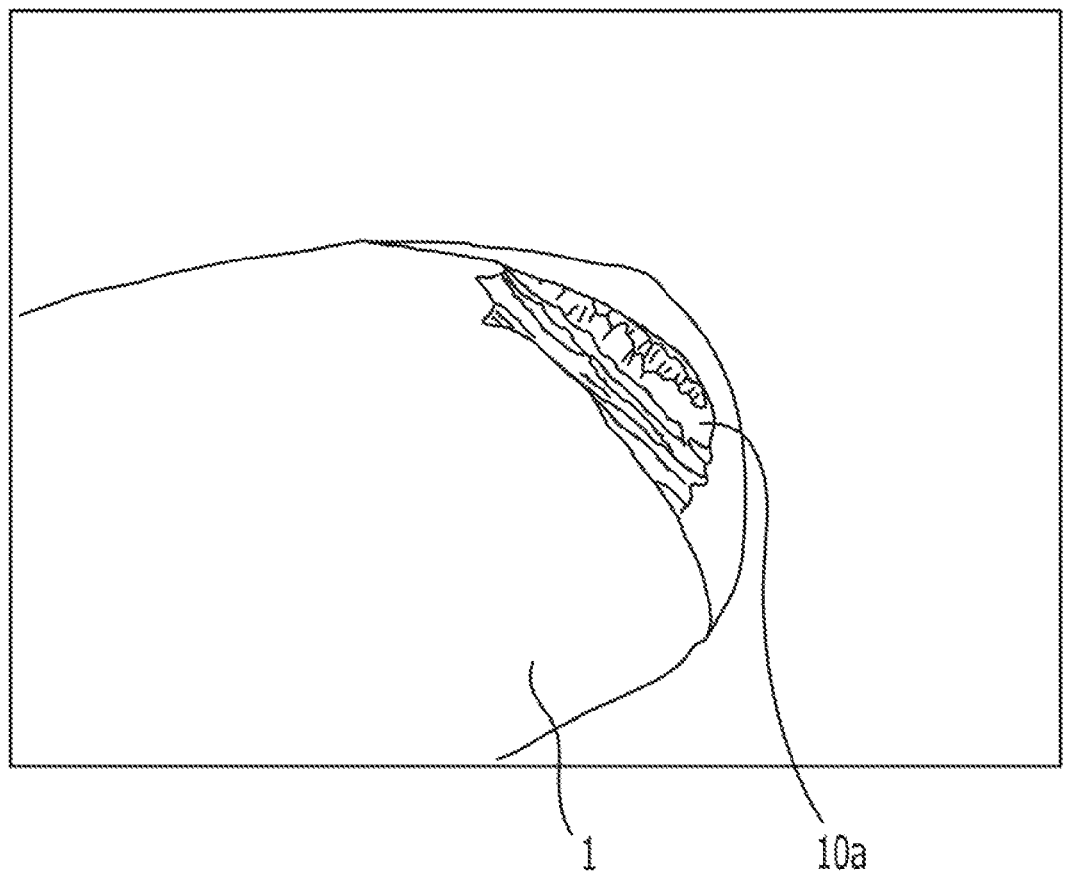
FIG. 4 illustrates an exemplary conducting film.

FIG. 4 illustrates an exemplary conducting film. FIG. 4 is based on a microscope photograph of a conducting film 10a. The conducting film 10a illustrated in FIG. 4 may be formed using the above transfer voltage V1.

For example, the material of the contactor base material 1 may include copper, and the material of the transfer conductor 10 may include gold. The diameter of the contactor base material 1 may be 1.6 mm, and the current density of the current I1 flowing by applying the transfer voltage V1 may be 18 A/mm.

As illustrated in FIG. 4, a conducting film 10a is formed based on covalent bonding between gold and copper using the pulse voltage. The formation area may be 0.2 mm×0.5 mm, and the conducting film 10a may be formed on the surface of the contactor base material 1 that contacts the transfer conductor 10.

The duty ratio of the pulse voltage may be arbitrary, and may be set based on the properties of the material of the contactor base material 1 and other factors.

The duty ratio may be small in order to reduce softening of the contactor base material 1 due to Joule heat. If softening of the contactor base material 1 does not pose a problem, a large duty ratio may be set or a continuous voltage may be applied, thereby promoting formation of the covalent bond layer 10b and forming the conducting film 10a in a short amount of time.

Figure 5:
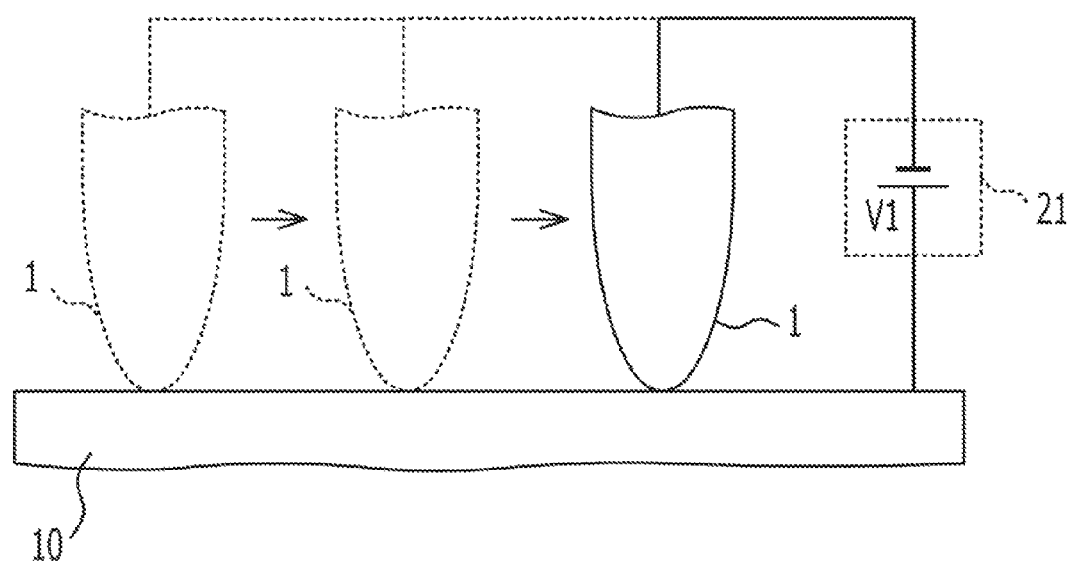
FIG. 5 illustrates an exemplary conducting film.

FIG. 5 illustrates an exemplary conducting film. As illustrated in FIG. 5, the conducting film 10a may be transferred in multiple stages while shifting the contact position between the transfer conductor 10 and the contactor 9. Local thinning of the film at the portions of the transfer conductor 10 contacted by the contactor 9 may be reduced, and the thickness of the conducting film 10a may be increased.

Figure 6A:
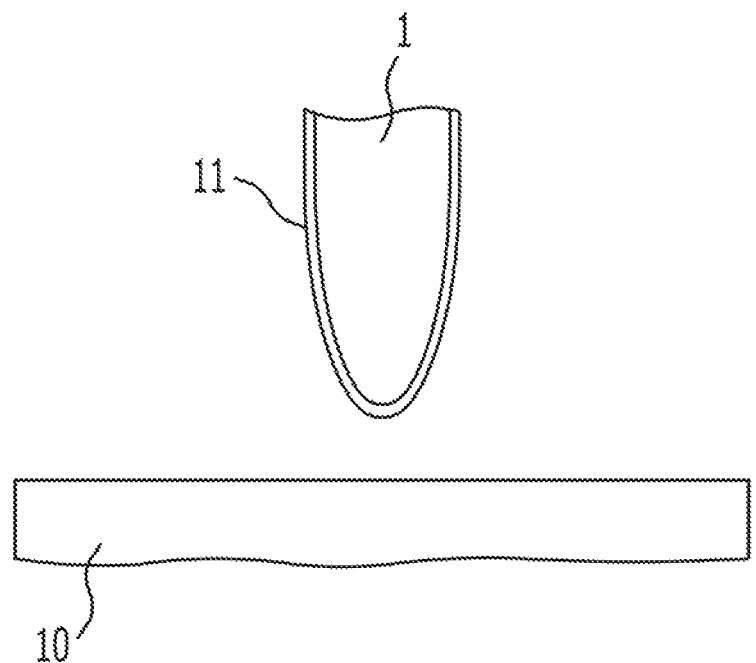
FIGS. 6A and 6B illustrate an exemplary test method.
Figure 6B:
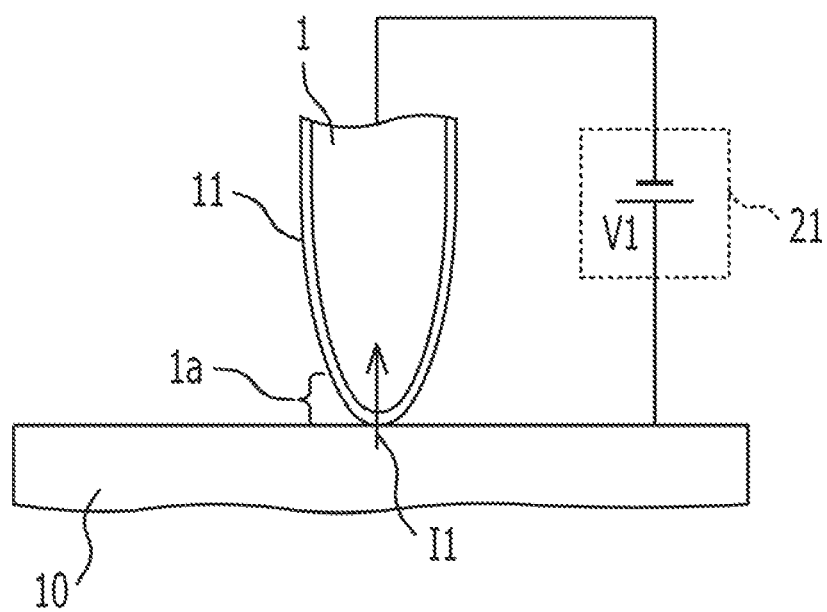
Figure 7A:
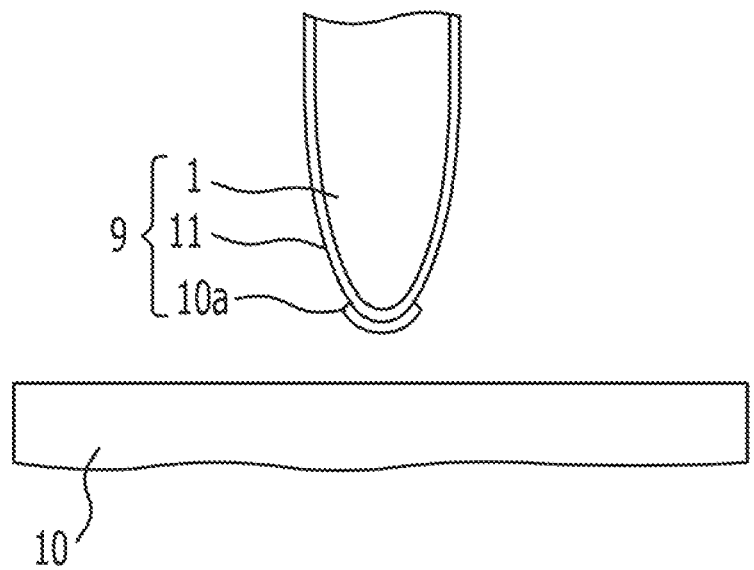
FIGS. 7A and 7B illustrate an exemplary test method.
Figure 7B:
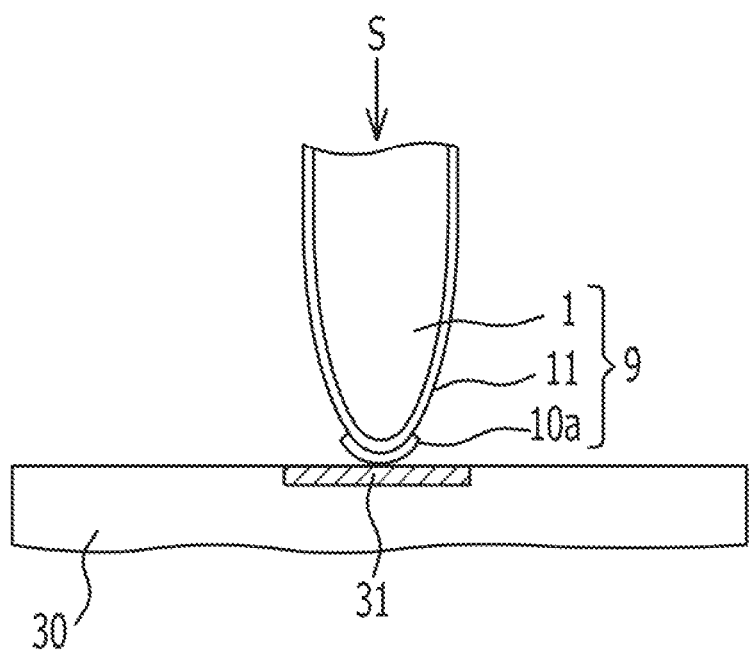

FIGS. 6A and 6B illustrate an exemplary test method. FIGS. 7A and 7B illustrate an exemplary test method. In FIGS. 6A to 7B, identical reference numbers are used for elements that are substantially the same as the elements illustrated in FIGS. 2A and 2B, and further description may be omitted or reduced.

As illustrated in FIG. 6A, a conducting thin film 11 is formed on the surface of the contactor base material 1 by electroplating or a similar technique.

A transfer conductor 10 is prepared together with the contactor base material 1.

As illustrated in FIG. 6B, the tip 1a of the contactor base material 1 is placed against the surface of the transfer conductor 10 via the conducting thin film 11, and a transfer voltage V1 generated by a first voltage generator circuit 21 is applied between the contactor base material 1 and the transfer conductor 10.

Since the current I1 flows between the conducting thin film 11 and the transfer conductor 10, electron movement is promoted in the respective materials of the conducting thin film 11 and the transfer conductor 10, and covalent bonds are formed between the materials.

When the contactor base material 1 is separated from the transfer conductor 10 as illustrated in FIG. 7A, some of the transfer conductor 10 is transferred to the conducting thin film 11 in the form of the conducting film 10a. As a result, a contactor 9 including the 10a and the contactor base material 1 is obtained. As illustrated in FIG. 7B, tip of the contactor 9 is made to contact the electrode 31 of the semiconductor apparatus 30, thereby supplying a test signal S to the contactor 9. The semiconductor apparatus 30 is electrically tested.

Wear on the contactor base material 1 due to contact with the electrode 31 is reduced by the conducting film 10a.

The conducting thin film 11 may be formed on the surface of the contactor base material 1 before forming the conducting film 10a.

Since the conducting thin film 11 is protected by the conducting film 10a, wear or peeling of the conducting thin film 11 may be reduced even after repeating tests, and processes to re-form the conducting thin film 11 may be omitted.

The function of the conducting thin film 11 may be determined by the material.

For example, when the affinity between the conducting thin film 11 and the transfer conductor 10 is higher than the affinity between the transfer conductor 10 and the contactor base material 1, the conducting film 10a is more easily transferred to the contactor 9 as compared to the case of no conducting thin film 11. The conducting thin film 11 may also be a bonding material for the conducting film 10a.

The two types of material may have increased affinity as the difference in the covalent radii decreases.

The material for the transfer conductor 10 and the material for the conducting thin film 11 may be selected such that the difference in covalent radii between the materials becomes smaller than the difference in covalent radii between the material for the transfer conductor 10 and the material for the contactor base material 1. In this case, the conducting thin film 11 may become a bonding material for the conducting film 10a.

Figure 8:
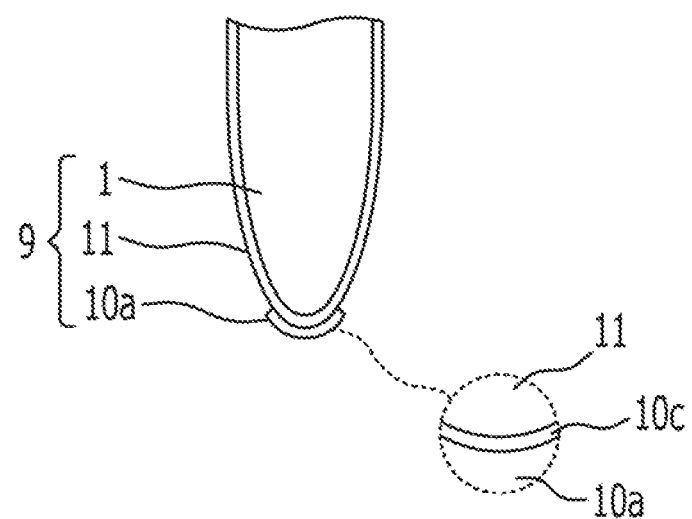
FIG. 8 illustrates an exemplary contactor.

FIG. 8 illustrates an exemplary contactor. FIG. 8 may be a cross-section of a contactor 9 when the difference between the covalent radius of the material of the transfer conductor 10 and the covalent radius of the material of the conducting thin film 11 is less than the difference in the covalent radii between the material for the transfer conductor 10 and the material for the contactor base material 1.

As illustrated in FIG. 8, a covalent bond layer 10c is formed by the current I1 at the interface between the conducting film 10a and the conducting thin film 11. The covalent bond layer 10c may be thinner than the conducting film 10a.

The materials may be arbitrary. For example, the contactor base material 1 may include an alloy of beryllium (covalent radius 90 pm) and copper, the conducting thin film 11 may include nickel (covalent radius 121 pm), and the transfer conductor 10 may include gold (covalent radius 144 pm).

Since the difference between the respective covalent radii for gold and nickel (23 pm) is less than the difference between the covalent radii for gold and beryllium (54 pm), the nickel in the conducting thin film 11 may become a bonding material for the gold in the conducting film 10a.

The conducting thin film 11 may also include an alloy of nickel and gold, instead of nickel.

Since the nickel in the conducting thin film 11 is more prone to oxidation than gold, the native oxide on the outer layer of the conducting thin film 11 may be removed by chemical process or mechanical polishing prior to activating the current I1 as illustrated in FIG. 6B. Therefore, a prevention from forming the covalent bond layer 10c (see FIG. 8) due to native oxide may be reduced, and the covalent bond layer 10c may be favorably formed on the conducting thin film 11.

The conducting thin film 11 may also include essentially the same material as the transfer conductor 10.

The transfer conductor 10 and the conducting thin film 11 may include gold. Since gold is less prone to oxidation compared to nickel, the conducting film 10a may be favorably formed on the conducting thin film 11 without removing the native oxide on the conducting thin film 11.

Since the conducting film 10a is formed on the tip of the contactor 9, wear on the contactor 9 may be reduced.

Since the conducting film 10a is worn away and becomes thinner due to repeated tests, the conducting film 10a may be restored.

Figure 9A:
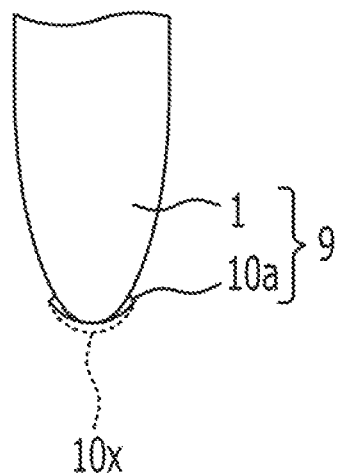
FIGS. 9A and 9B illustrate an exemplary test method.
Figure 9B:
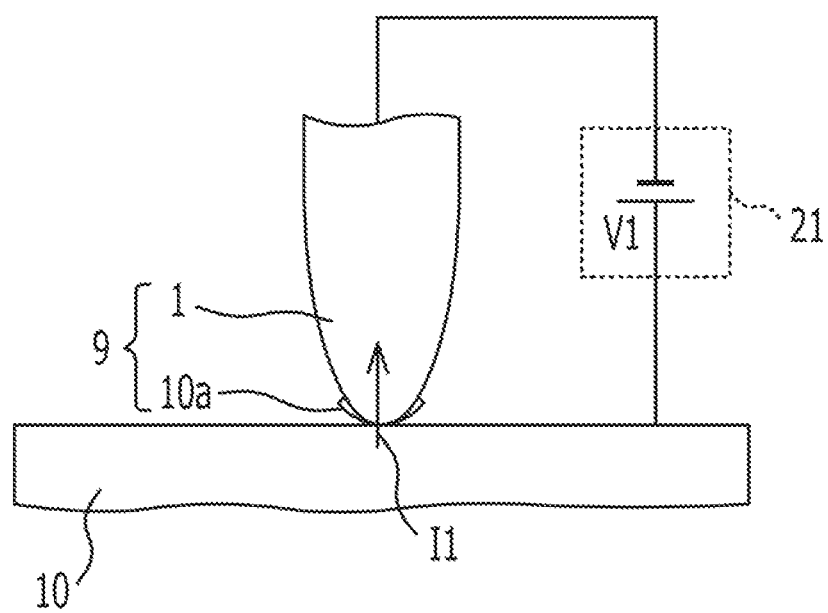
Figure 10A:
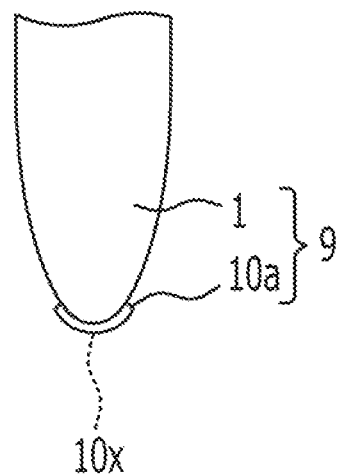
FIGS. 10A and 10B illustrate an exemplary test method.
Figure 10B:
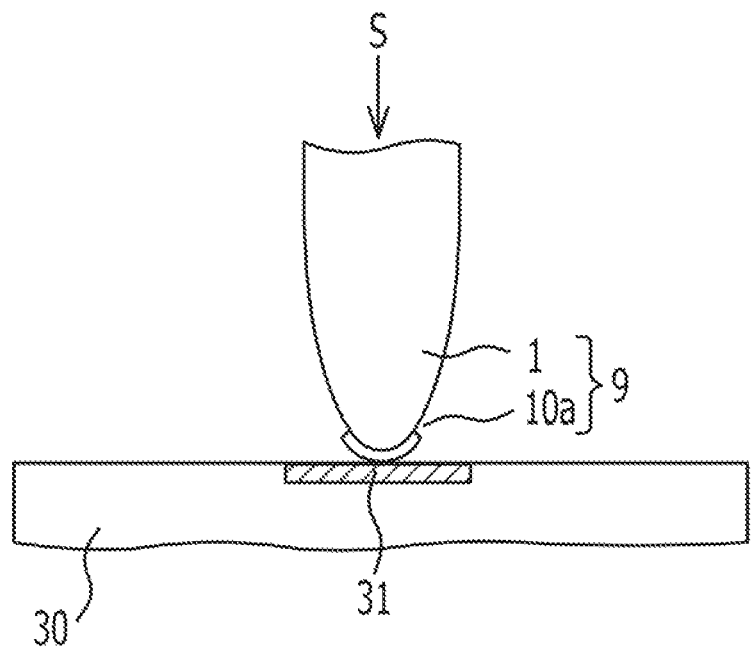

FIGS. 9A and 9B illustrate an exemplary test method. FIGS. 10A and 10B illustrate an exemplary test method. FIG. 11 illustrates an exemplary test method.

In an operation S10 illustrated in FIG. 11, a contactor 9 that has been used in repeated tests is prepared, as illustrated in FIG. 9A.

In the contactor 9, the conducting film 10a has been worn away by contact with the electrodes of the semiconductor apparatus, and an outer layer portion 10x may be lost.

The process proceeds to an operation S11.

As illustrated in FIG. 9B, the tip of the contactor 9 is placed against a transfer conductor 10 that includes substantially the same material as the conducting film 10a to be restored. The first voltage generator circuit 21 then applies a transfer voltage V1. Current I1 flows between the transfer conductor 10 and the contactor 9, and covalent bonds are formed between the outer layer material of the conducting film 10a and the material of the transfer conductor 10.

In an operation S12, the contactor 9 is separated from the transfer conductor 10, as illustrated in FIG. 10A. Since the outer layer material of the conducting film 10a and the material of the transfer conductor 10 were joined by covalent bonds in the operation S11, some of the transfer conductor 10 adheres to the transfer conductor 10, and the lost outer layer portion 10x of the conducting film 10a may be restored.

In an operation S13, as illustrated in FIG. 10B, the semiconductor apparatus 30 is tested by using a restored contactor 9 and supplying a test signal S to the semiconductor apparatus 30.

Since the outer layer portion 10x of the transfer conductor 10 that was worn away is restored, the tip of the contactor 9 is protected by the conducting film 10a, even after repeating a plurality of tests.

Electrode material adhering to the contactor 9 may be removed by cleaning.

FIGS. 12A to 14B illustrate an exemplary test method. FIG. 15 illustrates an exemplary test method. In FIGS. 12A to 15, identical reference numbers are used for elements that are substantially the same as the elements illustrated in FIGS. 1 to 5, and further description of such elements may be omitted or reduced.

Figure 12A:
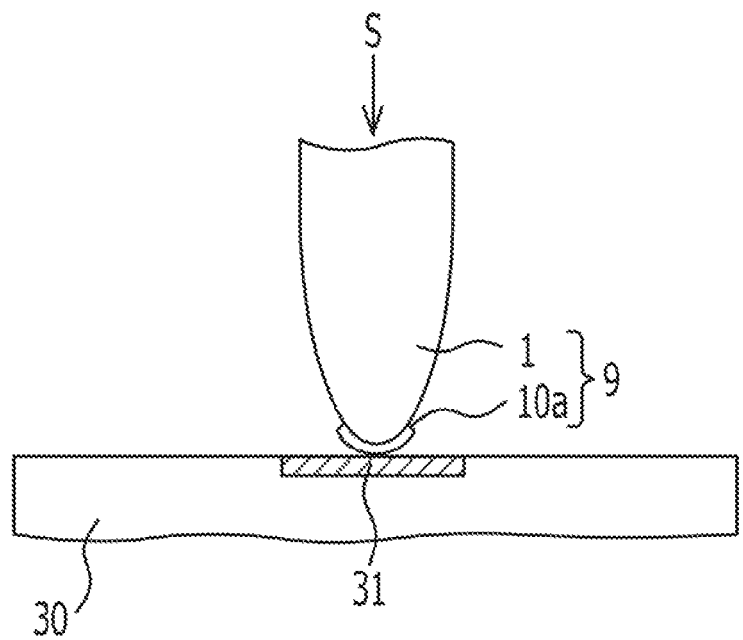
FIGS. 12A and 12B illustrate an exemplary test method.

In an operation S20 illustrated in FIG. 15, a contactor 9 including a conducting film 10a at its tip is prepared, as illustrated in FIG. 12A.

In an operation S21, a test signal S is supplied to the contactor 9 whose tip is contacted with the electrode 31 of the semiconductor apparatus 30, and the semiconductor apparatus 30 is electrically tested.

A number n of semiconductor apparatus 30 may be consecutively tested. The number n may be 100, for example.

Figure 12B:
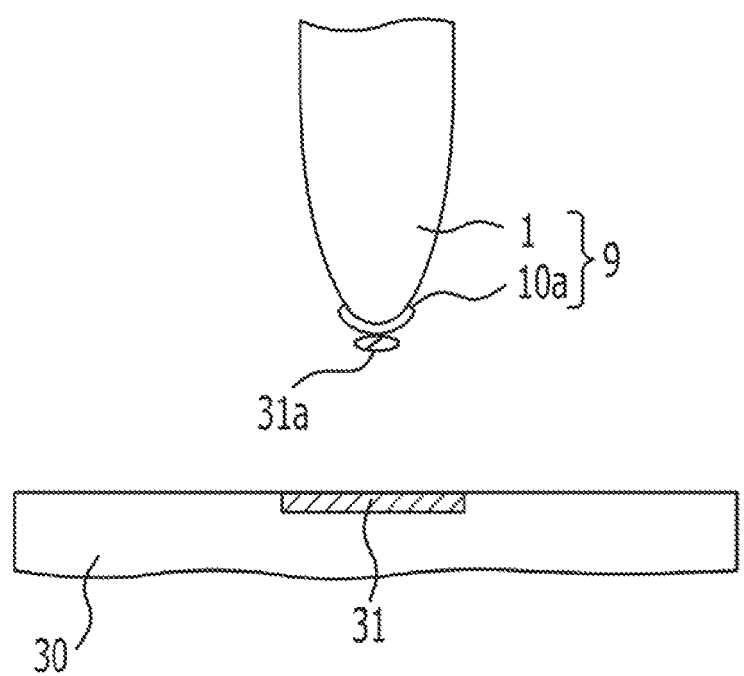

As illustrated in FIG. 12B, material 31a of the electrode 31 may adhere to the tip of the contactor 9.

If the material 31a oxidizes, the contact resistance between the contactor 9 and the electrode 31 may rise, and testing precision may be reduced.

Figure 13A:
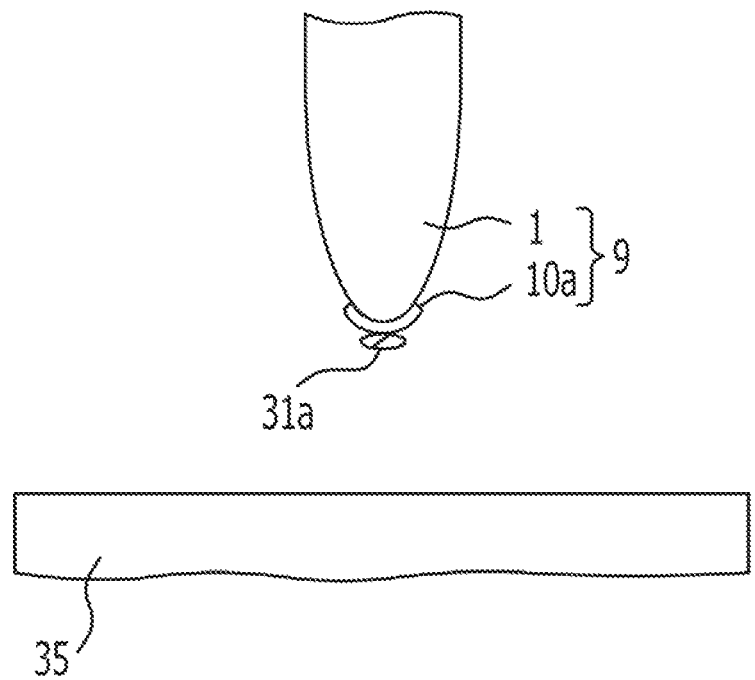
FIGS. 13A and 13B illustrate an exemplary test method.

In an operation S22, a cleaning conductor 35 is prepared, as illustrated in FIG. 13A.

Figure 13B:
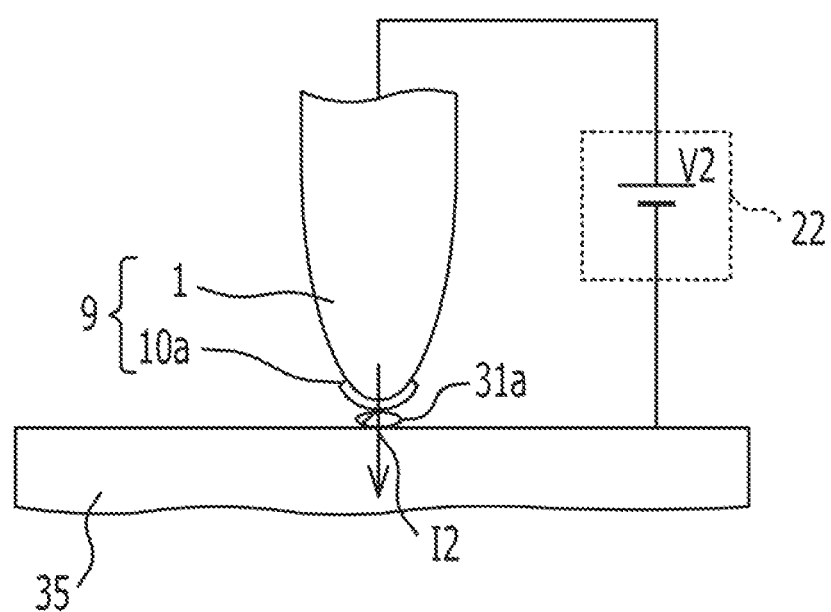

In an operation S23, the tip of the contactor 9 is placed against the cleaning conductor 35 as illustrated in FIG. 13B, and a cleaning voltage V2 generated by a second voltage generator circuit 22 is applied between the cleaning conductor 35 and the contactor 9.

An electron movement between the material 31a and the cleaning conductor 35 is promoted by a current I2 flowing between the electrode material 31a and the cleaning conductor 35, and covalent bonds are formed between the material 31a and the cleaning conductor 35.

The polarity of the voltage V2 may be arbitrary. For example, the voltage which alternates the positive and negative poles may be applied.

Figure 14A:
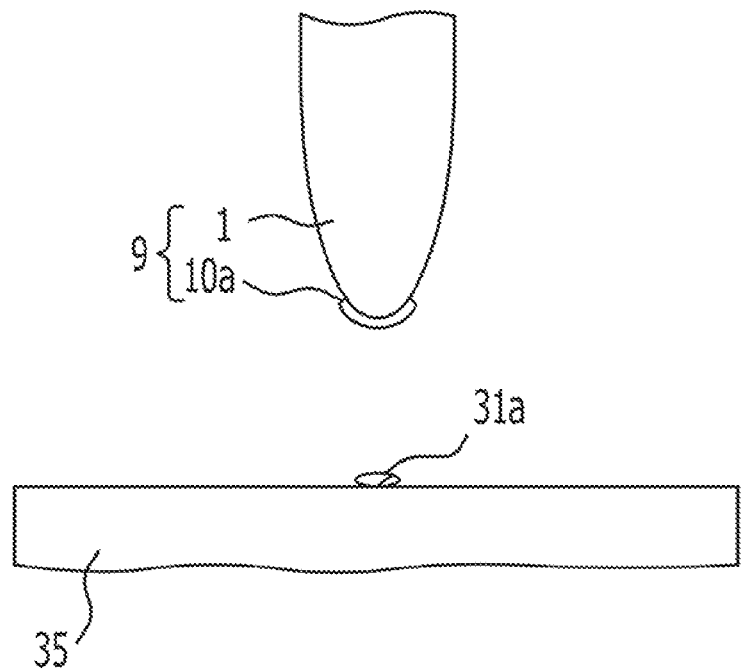
FIGS. 14A and 14B illustrate an exemplary test method.

In an operation S24, the contactor 9 is separated from the cleaning conductor 35, as illustrated in FIG. 14A.

Since the material 31a and the cleaning conductor 35 are joined by covalent bonds, the material 31a separates from the contactor 9 and adheres to the cleaning conductor 35.

The process then proceeds to an operation S25.

Figure 14B:
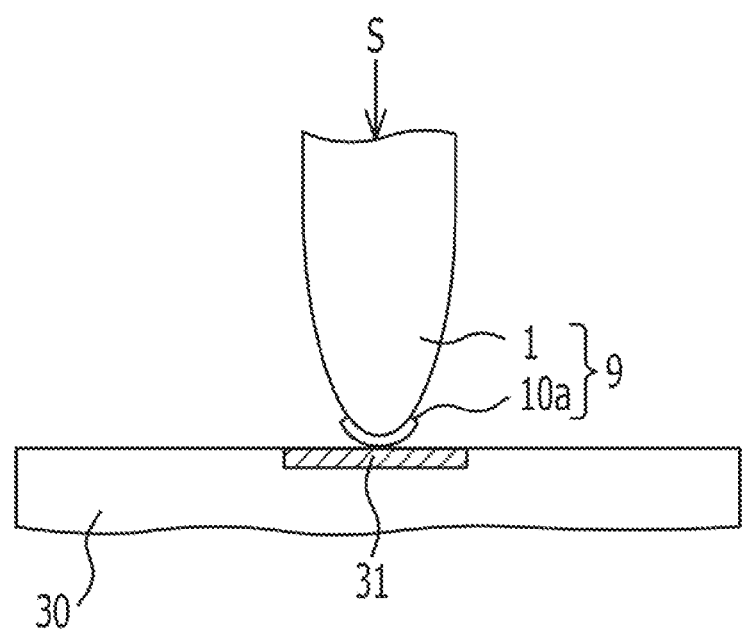

As illustrated in FIG. 14B, after the contactor 9 is cleaned so that the electrode material 31a is removed from the contactor 9, the semiconductor apparatus 30 is electrically tested using the contactor 9 by supplying a test signal to the electrode 31 of a semiconductor apparatus 30.

As illustrated in FIG. 13B, the electrode material 31a is easily removed from the contactor 9 by applying a cleaning voltage V2, and the contactor 9 is cleaned. As a result, contact resistance between the contactor 9 and the electrode 31 due to oxidation of electrode material 31a adhering to the contactor 9 may be reduced, and semiconductor apparatus 30 may be accurately tested.

Since the contactor 9 is cleaned using electrical energy, mechanical damage to the contactor 9 may be reduced, unlike removal by brushing or polishing.

The electrode material 31a covalently bonded to the cleaning conductor 35 may be selectively removed.

The cleaning voltage V2 is arbitrary. The cleaning voltage V2 may be set to a voltage that is greater than the maximum voltage of the test signal S in order to adhere the electrode material 31a to the cleaning conductor 35 reliably.

In order to reduce damage to the contactor 9 due to the Joule heat that accompanies the current I2, the cleaning voltage V2 may be a pulsed voltage and the current I2 may be flow intermittently.

The material of the cleaning conductor 35 may include a material having a high affinity with the material 31a in order to adhere the electrode material 31a to the cleaning conductor 35 more easily.

The two types of material may have increased affinity with closer covalent radii.

When the electrode material 31a includes a Group 14 element such as tin or lead, the material of the cleaning conductor 35 may include a Group 11 element with a covalent radius approximately equal to that of a Group 14 element. The electrode material 31a more easily adheres to the cleaning conductor 35. Covalent radii are illustrated in Table 1.

TABLE 1

| ELEMENT GROUP | GROUP 8 | GROUP 10 | GROUP 11 | | | GROUP 14 | |
|---|---|---|---|---|---|---|---|
| ELEMENT NAME | IRON | PALLADIUM | COPPER | SILVER | GOLD | TIN | LEAD |
| COVALENT RADIUS | 125 pm | 131 pm | 138 pm | 153 pm | 144 pm | 145 pm | 147 pm |

As illustrated in Table 1, the covalent radii of Group 11 elements are close to those of the Group 14 elements compared to those of the Group 8 or Group 10 elements. Thus, a Group 11 element may be suitable for the material of the cleaning conductor 35.

A material may be selected, based on a comparison of affinities between the electrode material 31a and the conducting film 10a, so as to strengthen the affinity between the electrode material 31a and the cleaning conductor 35. The electrode material 31a may adhere to the cleaning conductor 35 if the affinity is stronger. For this reason, the electrode material 31a may adhere to the cleaning conductor 35.

The conducting film 10a is formed on the tip in advance in order to reduce wear on the contactor 9. Cleaning of the electrode material 31a may be conducted on a contactor 9 on which the conducting film 10a is formed.

The timings when the contactor 9 is cleaned may be set based on the contact resistance between the contactor 9 and the electrode 31.

Figure 16:
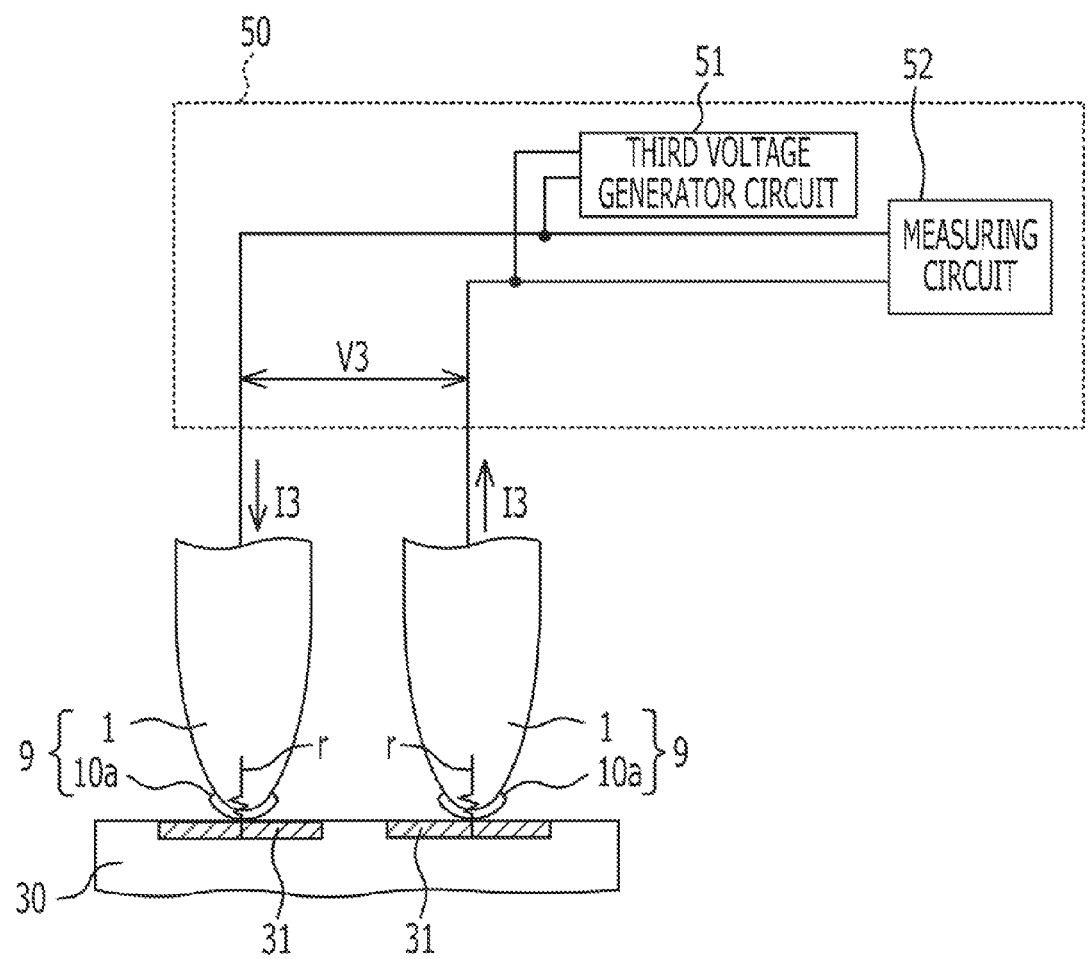
FIG. 16 illustrates an exemplary contactor processor.

FIG. 16 illustrates an exemplary contactor processor.

As illustrated in FIG. 16, a contact resistance measuring unit 50 is connected to two contactors 9.

The contact resistance measuring unit 50 includes: a third voltage generator circuit 51, which generates a reference voltage V3, and a measuring circuit 52, which measure resistance values.

The measuring circuit 52 calculates the resistance R between contactors 9 using the formula R=V3/I based on a current I3, which flows through the two contactors 9 and the internal circuits of the semiconductor apparatus 30, and the reference voltage V3.

As illustrated in FIG. 16, contact resistance r exists between each contactor 9 and electrode 31. For this reason, the flow pathway of the current I3 includes two contact resistances r. The resistance R also includes the two contact resistances r. Since the conducting film 10a is worn away due to the repeated tests, the contact resistance r increases. The measuring circuit 52 measures the value of the contact resistance r taking the increase in the resistance R from the first test as being substantially equal to twice the contact resistance r.

Figure 17:
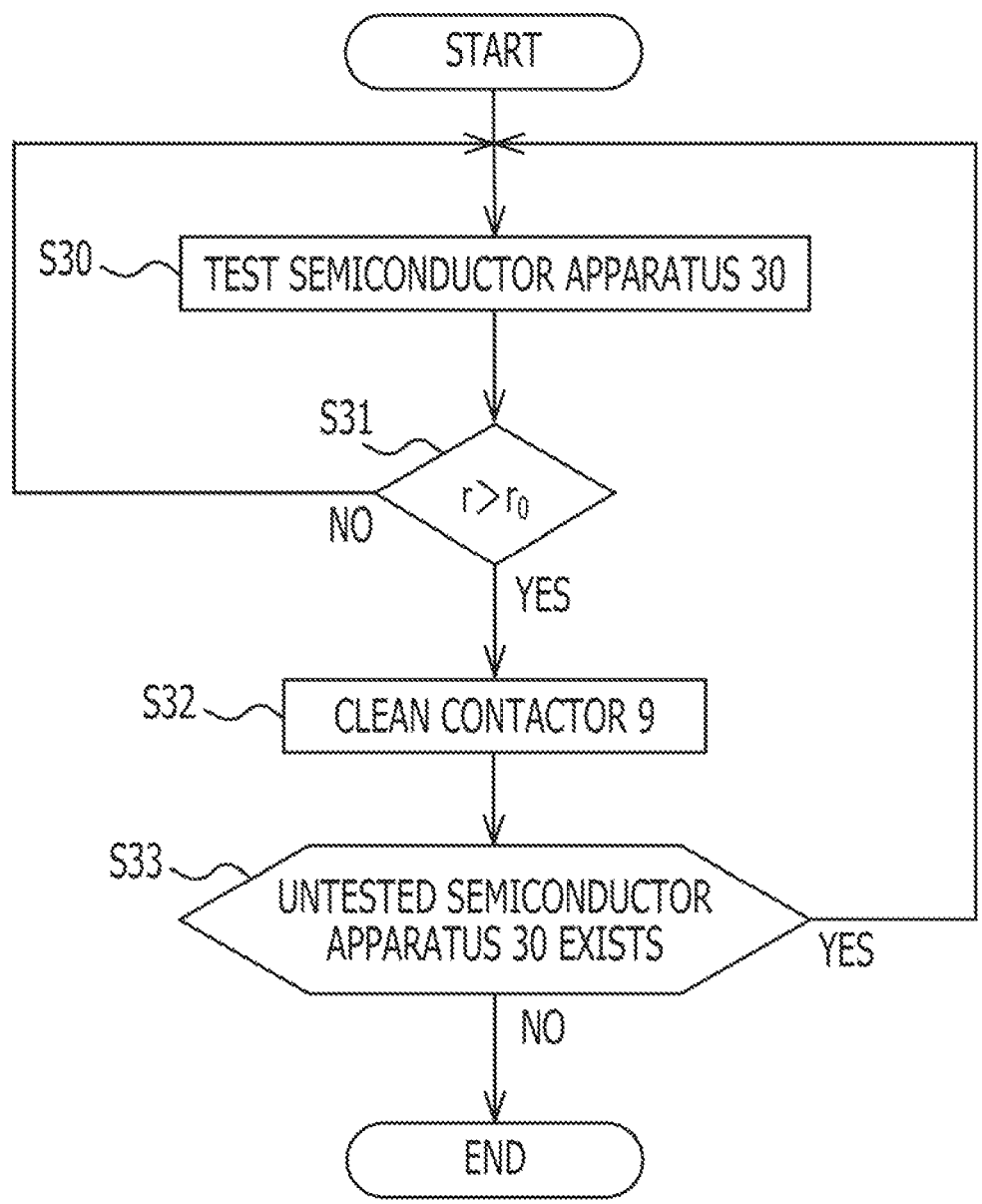
FIG. 17 illustrates an exemplary test method.

FIG. 17 illustrates an exemplary test method.

In an operation S30, the contactor 9 is used to test a semiconductor apparatus 30.

In an operation S31, it is determined whether or not the contact resistance r between the contactor 9 and the electrode 31 during the test in the operation S30 exceeds a value r0.

When exceeding the value r0, the process returns to the operation S30 without cleaning the contactor 9, and a semiconductor apparatus 30 is tested.

When not exceeding the value r0, some electrode material 31a may be adhering to the tip of the contactor 9.

In the operation S32, the contactor 9 is cleaned. The cleaning method may be substantially the same as or similar to the method illustrated in the operations S21 to S23.

In an operation S33, it is determined whether or not there exists a semiconductor apparatus 30 to be tested.

When a semiconductor apparatus to be tested exists, the process proceeds to the operation S30. When a semiconductor apparatus to be tested does not exist, the process is terminated.

The resistance r between the contactor 9 and the electrode 31 is measured, and it is determined whether or not the contactor 9 will be cleaned. Cleaning may not be conducted when a small amount of electrode material 31a is adhering to the tip of the contactor 9.

Figure 18:
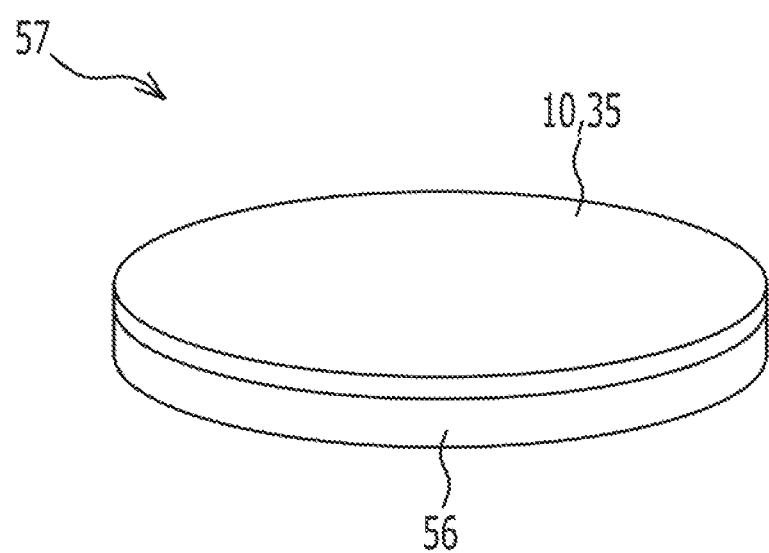
FIG. 18 illustrates an exemplary dummy wafer.

FIG. 18 illustrates an exemplary dummy wafer. FIG. 18 may be a perspective view of a dummy wafer.

The dummy wafer 57 may have a wafer shape and include at least one of a transfer conductor 10 and a cleaning conductor 35 on a stiffener 56 such as a stainless steel plate, for example.

The dummy wafer 57 is used inside a wafer prober. For this reason, during between tests of product wafers, the conducting film 10a may be transferred to the prober, or alternatively, the prober may be cleaned as illustrated in FIGS. 12A to 17.

Since the shape of the dummy wafer 57 is substantially the same as or similar to the shape of a product wafer, the dummy wafer 57 may be handled inside a known wafer prober.

Figure 19:
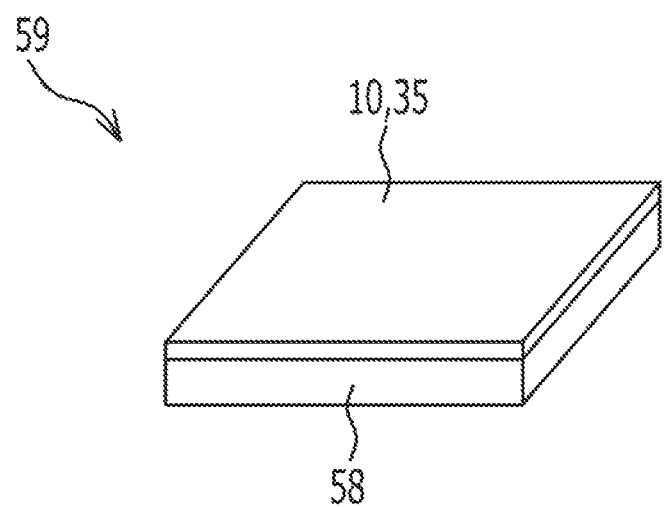
FIG. 19 illustrates an exemplary dummy package.

FIG. 19 illustrates an exemplary dummy package. FIG. 19 may be a perspective view of a dummy package.

The dummy package 59 may have a semiconductor package shape and include at least one of a transfer conductor 10 and a cleaning conductor 35 on a stiffener 58 such as a stainless steel plate, for example.

The dummy package 59 is used inside an IC tester. For this reason, during between tests of product packages, the conducting film 10a may be transferred to the prober, or alternatively, the prober may be cleaned as illustrated in FIGS. 12A to 17.

Since the shape of the dummy package 59 is substantially the same as or similar to the shape of a product package, the dummy package 59 may be handled inside a known IC tester.

A contactor processor 60 may also be used without using a wafer prober or IC tester.

Figure 20:
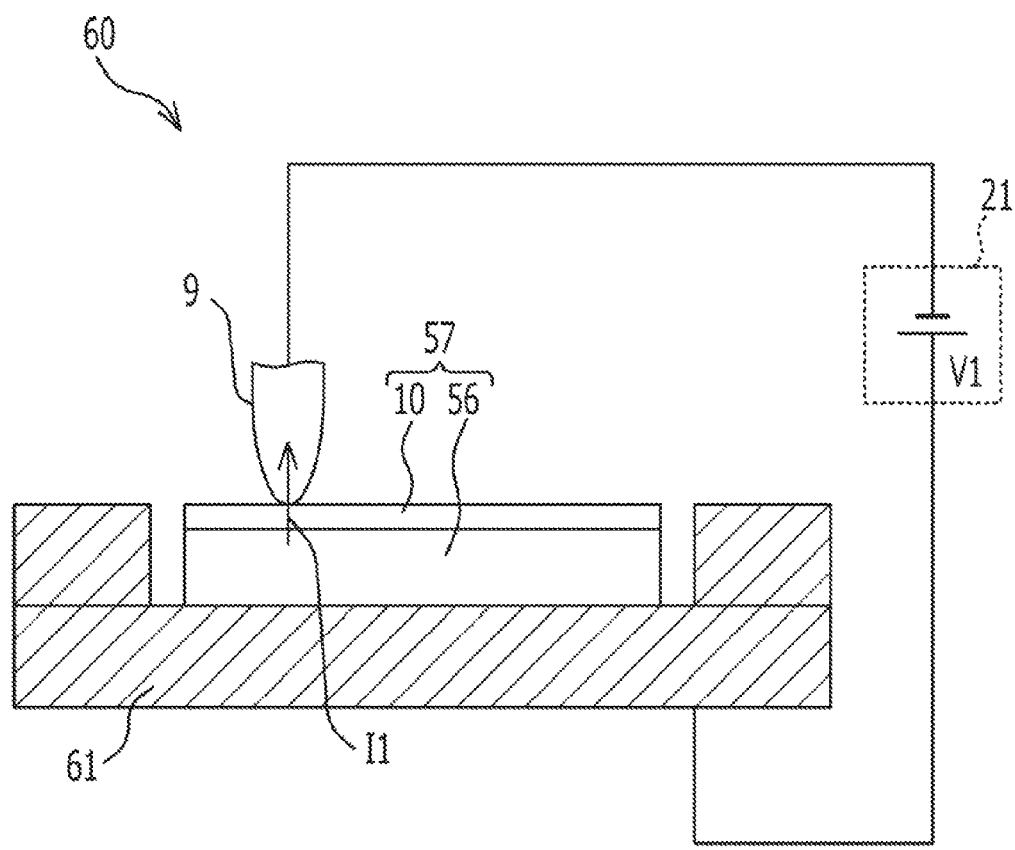
FIG. 20 illustrates an exemplary contactor processor.

FIG. 20 illustrates an exemplary contactor processor. FIG. 20 may be a perspective view of a contactor processor 60.

The contactor processor 60 includes a conductive stage 61 and a first voltage generator circuit 21. One of the poles of the transfer voltage V1 generated by the first voltage generator circuit 21 is coupled to the stage 61, while the other pole is coupled to the contactor 9.

A dummy wafer 57 is placed on the stage 61 with the stiffener 56 side down. In FIG. 20, a dummy wafer 57 that includes a transfer conductor 10 may be placed on the stage 61.

When the stiffener 56 includes a conductive material such as stainless steel, a current may be supplied to the stiffener 56 via the conductive stage 61. A current I1 flows between the transfer conductor 10 and the contactor 9, and a conducting film 10a may be transferred to the tip of the contactor 9 as illustrated in FIGS. 1 to 5.

Figure 21:
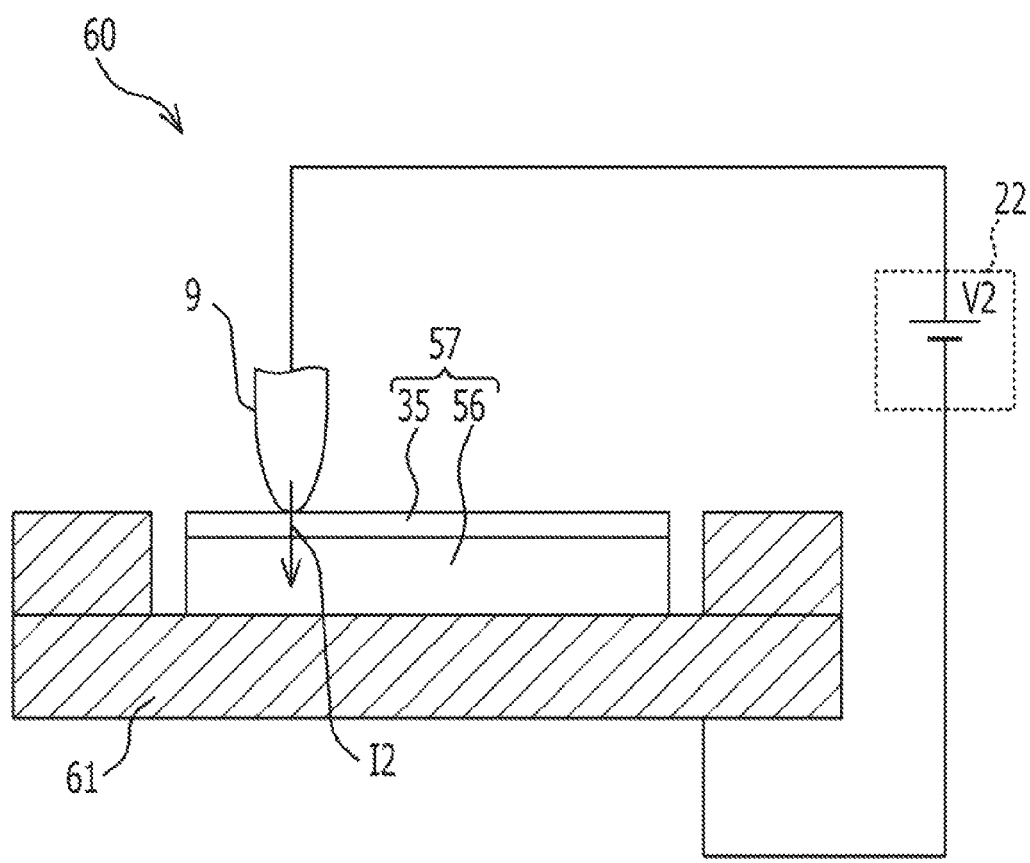
FIG. 21 illustrates an exemplary contactor processor.

FIG. 21 illustrates an exemplary contactor processor. The contactor processor illustrated in FIG. 21 includes a second voltage generator 22. FIG. 21 may be a cross-section of the contactor processor 60.

A dummy wafer 57 that includes a cleaning conductor 35 is placed on the stage 61.

When the stiffener 56 includes a conductive material, a current I2 may flow between the cleaning conductor 35 and the contactor 9, and the contactor 9 may be cleaned as illustrated in FIGS. 9A to 15.

A dummy package may be placed on the stage 61 instead of the dummy wafer 57.

Figure 22:
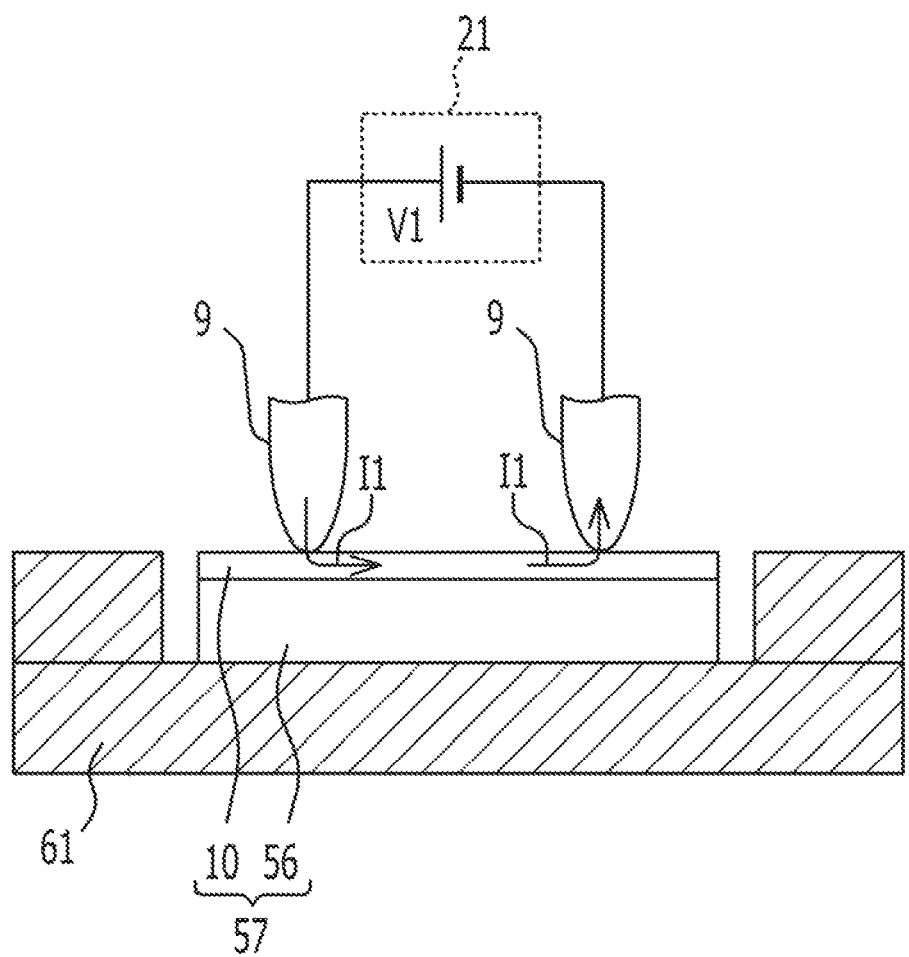
FIG. 22 illustrates an exemplary stiffener.

FIG. 22 illustrates an exemplary stiffener. The stiffener 56 illustrated in FIG. 22 may include an insulator such as a resin or rubber. FIG. 22 may illustrate a cross-section of a stiffener.

Since the stiffener 56 includes an insulator, a voltage between the transfer conductor 10 and the contactor 9 may not be applied via the stiffener 56 as illustrated in FIGS. 20 and 21.

In FIG. 22, the two contactors 9 are placed against the transfer conductor 10 at substantially the same time, thereby forming a current pathway between the contactors 9 and the transfer conductor 10. When a transfer voltage V1 is applied between the two contactors 9, a current I1 flows through each contactor 9, even if the stiffener 56 includes an insulator. For this reason, a conducting film 10a may be transferred to the contactors 9.

In FIG. 22, the transfer voltage V1 is used. The cleaning voltage V2 may also be used. The cleaning conductor 35 may be used instead of the transfer conductor 10 to clean the tips of the contactors 9.

Figure 23A:
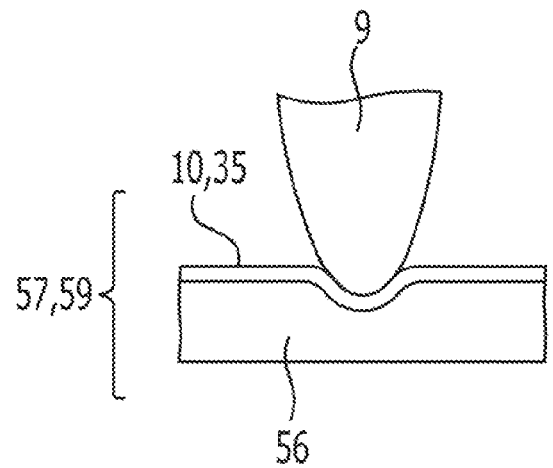
FIGS. 23A, 23B, and 23C illustrate an exemplary stiffener.
Figure 23B:
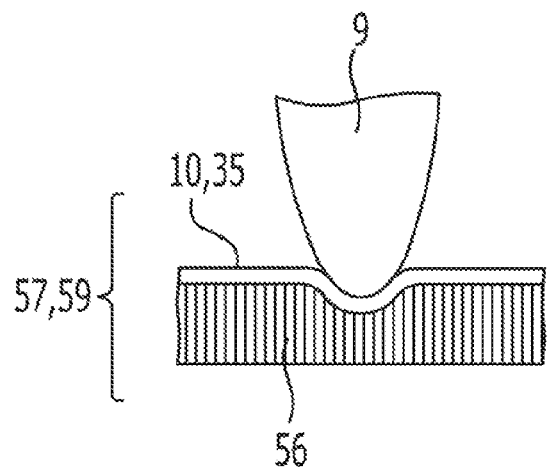
Figure 23C:
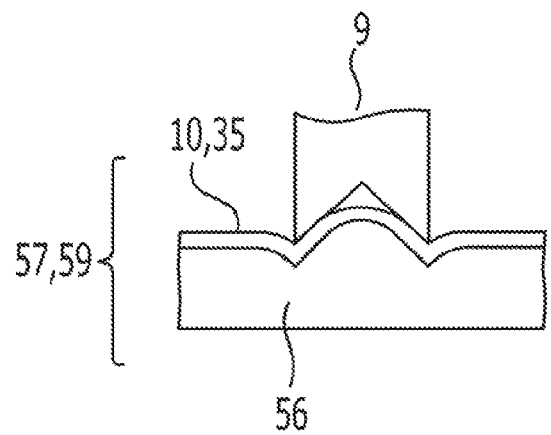

FIGS. 23A to 23C illustrate exemplary stiffeners. The stiffener illustrated in FIGS. 23A to 23C may be the stiffener 56 in the dummy wafer 57 and the dummy package 59. FIGS. 23A to 23C may be cross-sections of the stiffener 56.

In FIG. 23A, the stiffener 56 may include an elastic body such as rubber.

When the contactor 9 contacts the dummy wafer 57 or the dummy package 59, the stiffener 56 elastically deforms, and the tip portion of the contactor 9 becomes embedded inside the stiffener 56.

When the dummy wafer 57 or the dummy package 59 includes the transfer conductor 10, the transfer voltage V1 may be applied between the transfer conductor 10 and the contactor 9 while the stiffener 56 is in an elastically deformed state. For this reason, a conducting film 10a may be transferred to a broad area of the tip of the contactor 9.

When the dummy wafer 57 or the dummy package 59 includes the cleaning conductor 35, the cleaning voltage V2 may be applied between the cleaning conductor 35 and the contactor 9. For this reason, a broad area of the tip of the contactor 9 may be cleaned.

In FIG. 23B, the stiffener 56 may include an elastic body with conductive properties.

The elastic body with conductive properties may include, for example, a rubber embedded with a plurality of metal filaments parallel to the normal direction of the principal surface of the stiffener 56 or a rubber including dispersed carbon or other conductive particles. Since an elastic body with conductive properties is used, the current I1 or the current I2 is supplied from the stiffener 56 to the contactor 9 as illustrated in FIG. 20 or 21.

FIG. 23C may be a cross-section of a contactor 9 having a depression in the center of its tip.

The depressed tip may be suitable for projecting electrodes such as solder bumps.

The contactor 9 may be used in a wafer prober that tests semiconductor apparatus at the wafer level.

Figure 24:
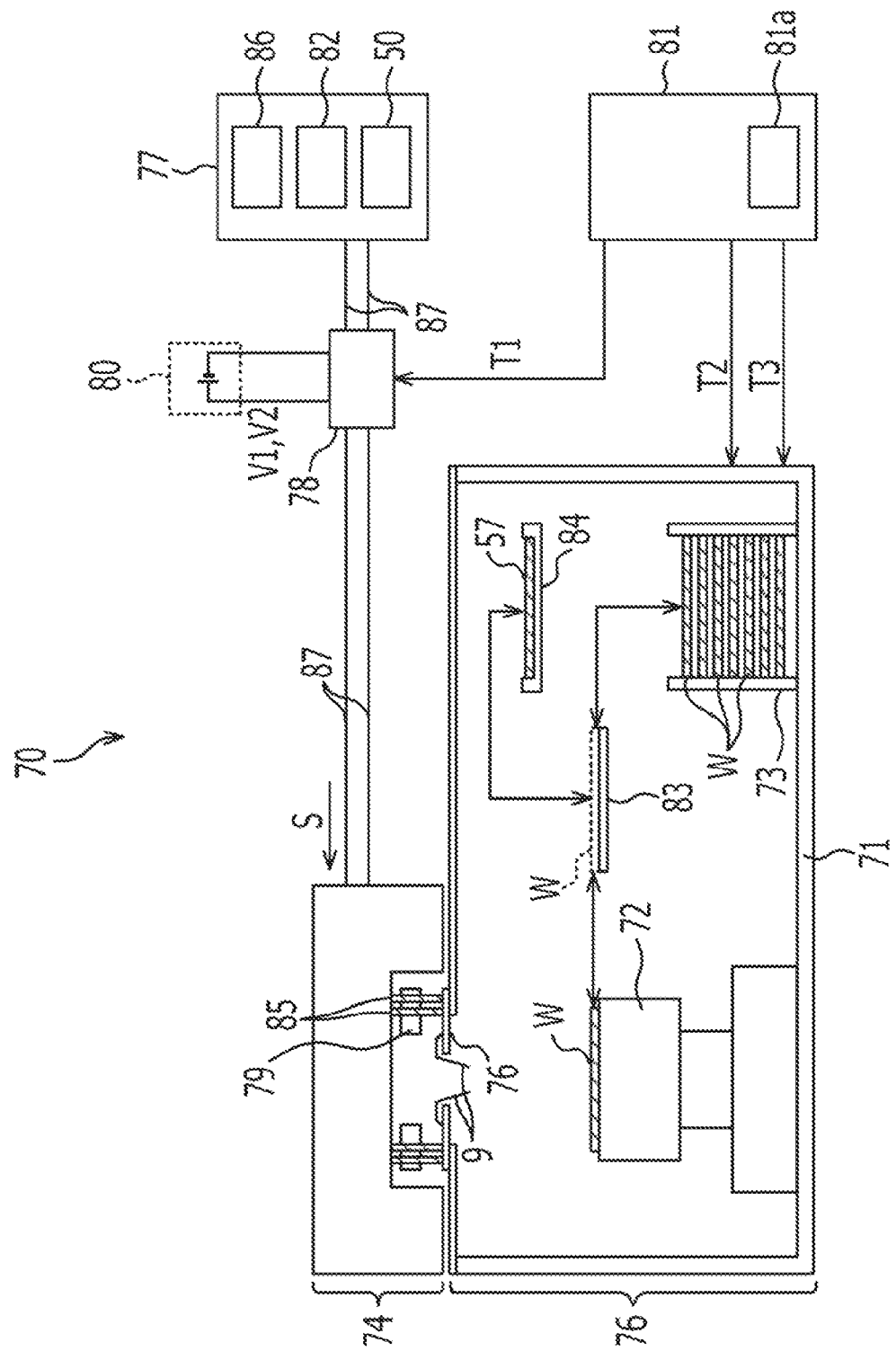
FIG. 24 illustrates an exemplary test device.

FIG. 24 illustrates an exemplary test device. In FIG. 24, identical reference numbers used for elements that are substantially the same as or similar to the elements illustrated in FIGS. 1 to 23, and further description may be omitted or reduced.

The test device 70 may be a wafer prober, and may include a tester 74, a prober 76, a test circuit 77, a switching circuit 78, a voltage generator circuit 80, and a controller circuit 81. The prober 76 includes a chassis 71 that houses a stage 72. The stage 72 may horizontally or vertically drive a wafer W to be tested using a stepping motor not illustrated in the drawings.

A magazine 73 housing a plurality of wafers W may be provided inside the chassis 71, and a transport robot 83 shuttles the wafers W between the stage 72 and the magazine 73. The transport robot 83 also moves a dummy wafer 57 placed in a dummy holder 84 to the stage 72.

A probe card 76 may be affixed to the chassis 71 above the stage 72.

The contactors 9 may be provided as probes on the probe card 76 as illustrated in FIGS. 1 to 17. The probe card 76 is placed against a plurality of pogo pins 85 supported by a contact ring 79, and a test signal S is supplied from the pogo pins 85 to the contactors 9.

The test circuit 77 includes a test signal generator circuit 86, which generates a test signal S and outputs the signal to a signal line 87. Output signals which are output from a wafer W based on a test signal S are supplied to a decision circuit 82 inside the test circuit 77. The decision circuit 82 determines whether or not each semiconductor apparatus has functions based on the output signals from respective semiconductor apparatus on a wafer W.

The test circuit 77 may include a contact resistance measuring unit 50 as illustrated in FIG. 16 or 17.

The switching circuit 78 selects one of the transfer voltage V1 or the cleaning voltage V2 generated by the voltage generator circuit 80, or the test signal S. The switching circuit 78 supplies the selected output to the tester 74 via the signal line 87.

Since the voltage generator circuit 80 is provided separately from the test signal generator circuit 86, the voltages V1 and V2 which are not used for tests may be set higher than the maximum voltage of the test signal S.

The switching circuit 78 may include a plurality of relays in accordance with the number of pogo pins 85.

Some or all of the contactors 9 on the probe card 76 are coupled to the voltage generator circuit 80 by the switching circuit 78.

The switching timings of the switching circuit 78 may be controlled by a switching signal T1 output from the controller circuit 81.

The controller circuit 81 outputs the switching signal T1, a transport signal T2 for driving the transport robot 83, and a stage signal T3 for controlling the horizontal or vertical motion of the stage 72. The transport robot 83 and the stage 72 are controlled, respectively based on the signals T2 and T3.

The controller circuit 81 may also include a program unit 81a that stores output timings for the signals T1 to T3.

The output timings of the signals T1 to T3 may be arbitrarily stored in the program unit 81a. The controller circuit 81 may transfer the conducting film 10a to the tip of the contactor 9 or clean the contactor 9 at arbitrary timings, and execute the test methods illustrated in FIGS. 3A and 3B, 10A and 10B, 14A and 14B, and 16, for example.

Figure 25:
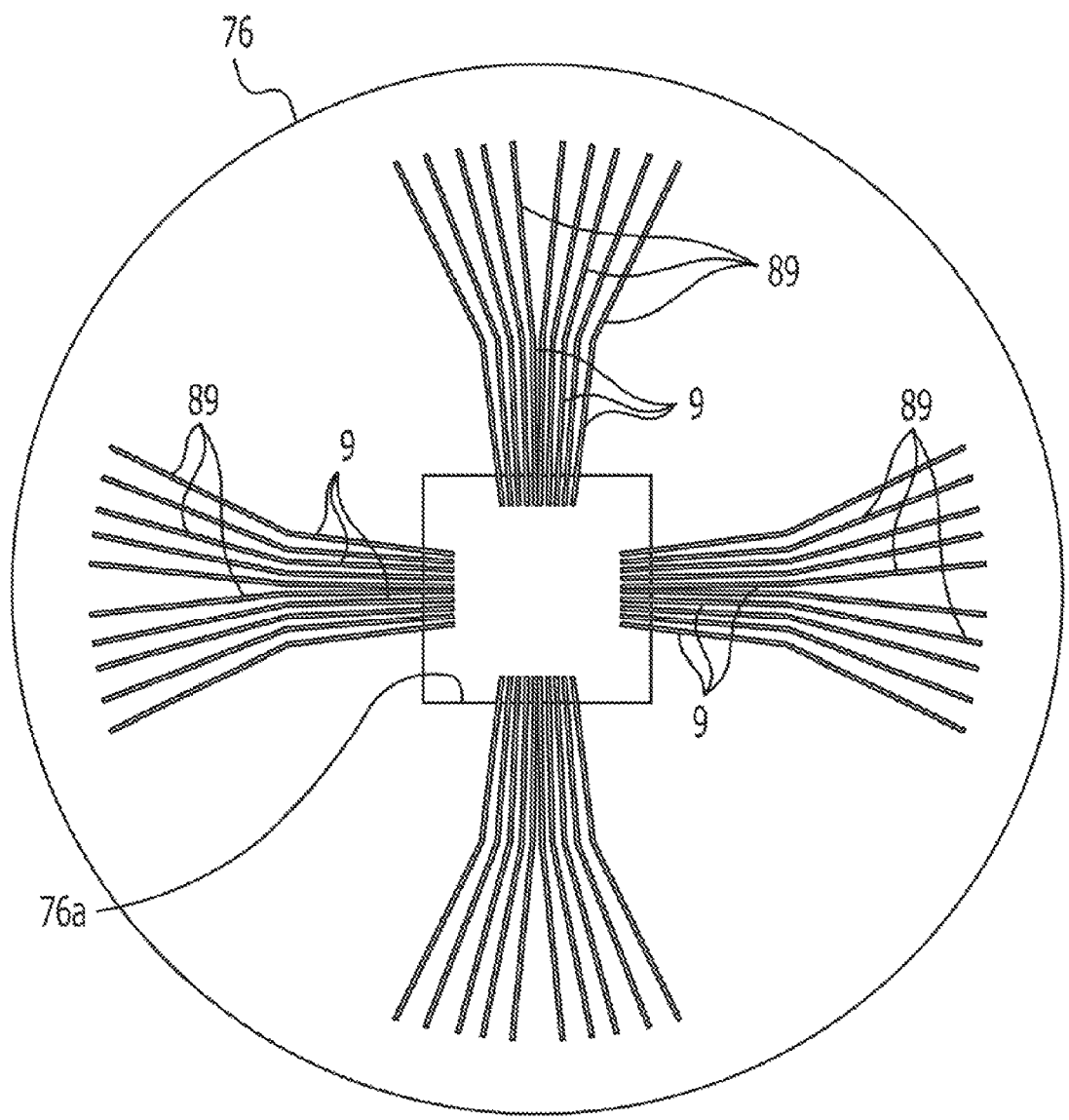
FIG. 25 illustrates an exemplary probe card.
Figure 26:
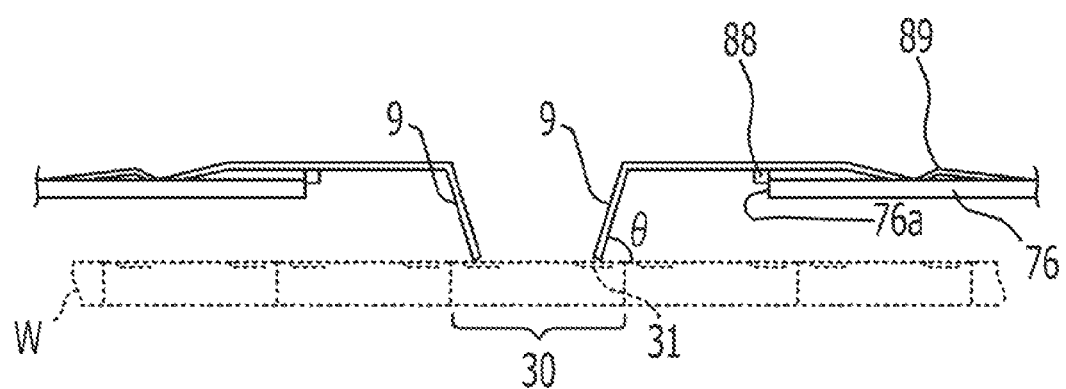
FIG. 26 illustrates an exemplary probe card.

FIGS. 25 and 26 illustrate an exemplary probe card. FIG. 25 is a plan view of the probe card 76, while FIG. 26 is an enlarged partial cross-section of FIG. 25.

The probe card 76 may include a circuit substrate including laminated metal and insulating layers, and may also include a central aperture 76a, as illustrated in FIG. 25.

As illustrated in FIG. 26, contactors 9 corresponding to the probes are provided so as to extend from the top of the probe card 76 and downward into the aperture 76a.

Insulating spacers 88 are provided between the top surface of the probe card 76 and the contactors 9. By inserting the spacers 88, the height of the contactors 9 from the top of one of the wafers W is increased, and thus the angle of contact θ between the contactors 9 and one of the wafers W may be increased.

The base ends of the contactors 9 are coupled to a trace pattern 89 on the uppermost later which is formed by copper foil patterning, for example. The trace pattern 89 is placed against the pogo pins 85, for example, and a test signal S is supplied from the pogo pins 85 to the trace pattern 89.

Figure 27:
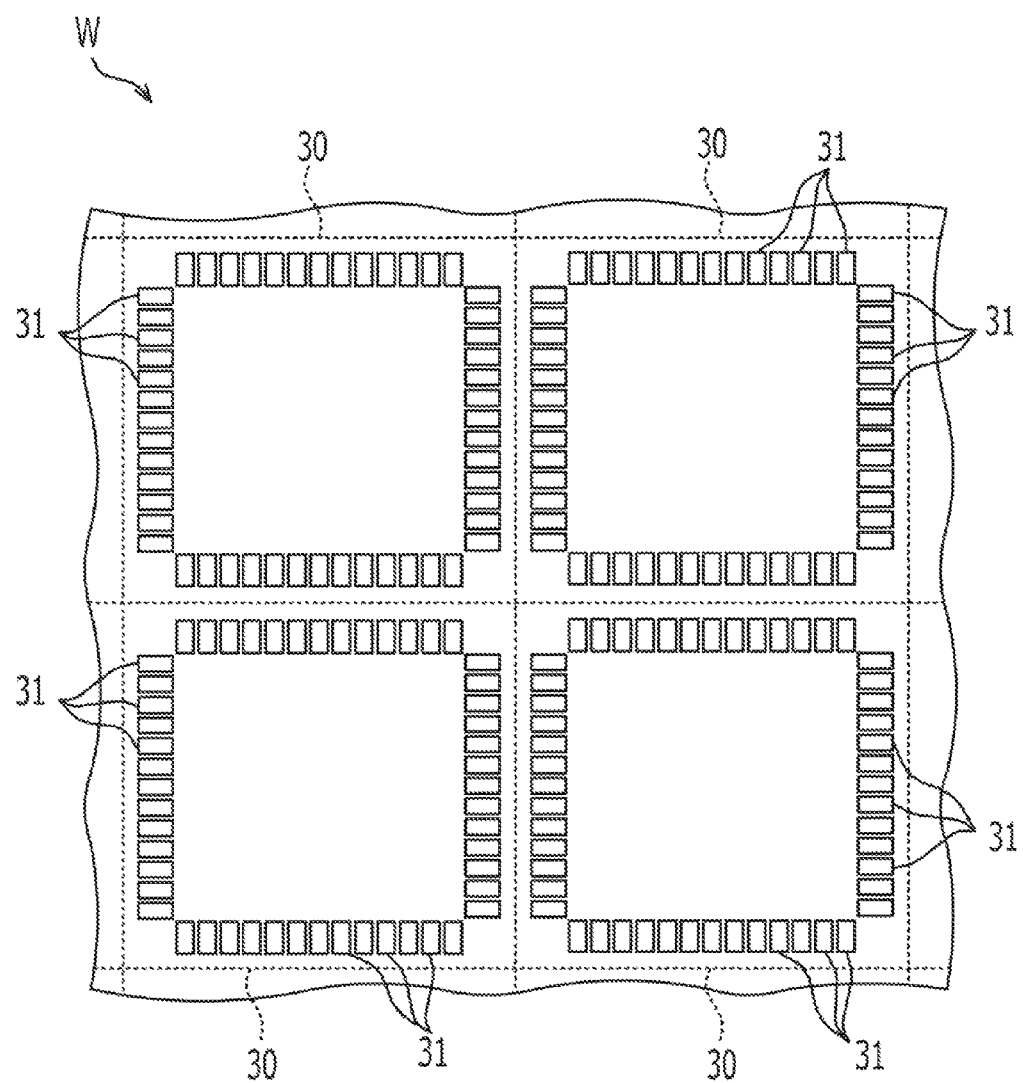
FIG. 27 illustrates an exemplary wafer.

FIG. 27 illustrates an exemplary wafer. FIG. 27 is an enlarged plan view of a wafer W.

As illustrated in FIG. 27, the probe card 76 may be implemented to test peripheral semiconductor apparatus 30 upon which electrodes 31 are arranged at the periphery of the chip regions.

Figure 28:
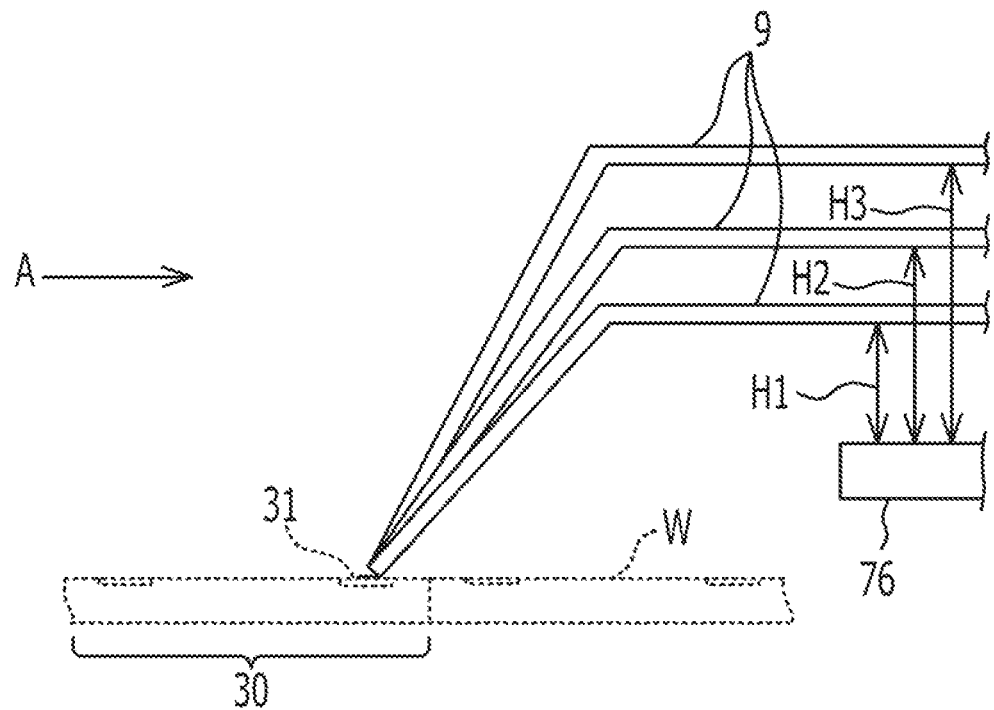
FIG. 28 illustrates an exemplary contactor.

FIG. 28 illustrates exemplary contactors. FIG. 28 may be a lateral view illustrating exemplary bends in the contactors 9.

The heights of the respective contactors 9 from the top of the probe card 76 are varied among the heights H1 to H3, thereby increasing the spacing among the contactors 9. Therefore, the contactors 9 may not contact each other above the probe card 76.

FIG. 29 illustrates exemplary contactors. FIG. 29 is a lateral view as seen from the direction A in FIG. 28.

As illustrated in FIG. 29, the diameter of each contactor 9 is narrowest at the tip 9a contacting one of the electrodes 31, and widens with increasing distance from the tip 9a.

By narrowing the tips 9a, the pitch of the electrodes 31 is decreased. By widening the contactors 9 away from the tips 9a, the strength of the contactors 9 is maintained.

For example, the diameter of each contactor 9 above the probe card 76 may be from 100 μm to 130 μm, while the pitch of the electrodes 31 may be approximately 50 μm.

Figure 30A:
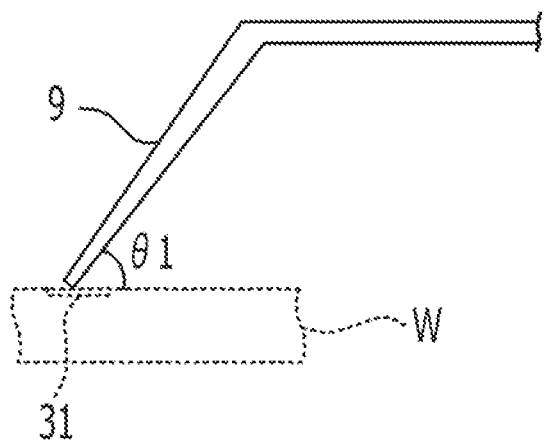
FIGS. 30A to 30C illustrate an exemplary contactor.
Figure 30B:
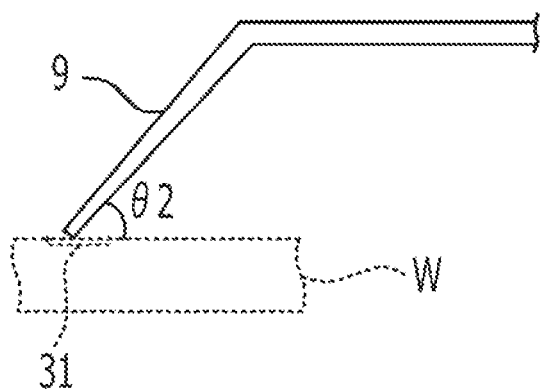
Figure 30C:
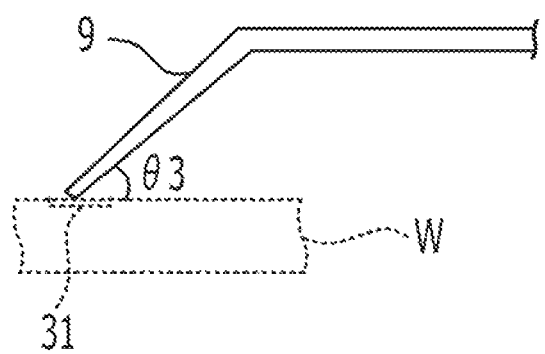

FIGS. 30A to 30C illustrate exemplary contactors. FIGS. 30A to 30C may be lateral views of the respective contactors 9 illustrated in FIG. 28.

Since the contactors 9 have different heights, the contact angles θ1 to θ3 with the wafer W differ for each contactor 9, as illustrated in FIGS. 30A to 30C.

Figure 31A:
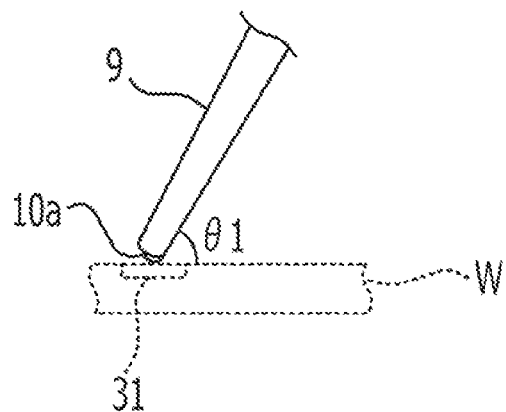
FIGS. 31A to 31C illustrate an exemplary contactor.
Figure 31B:
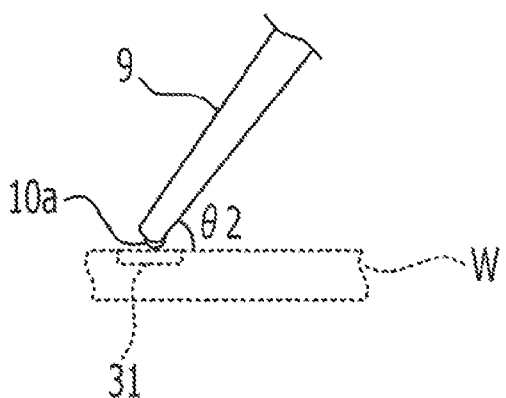
Figure 31C:
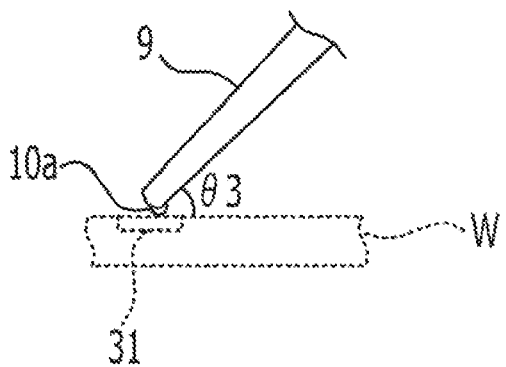

FIGS. 31A to 31C illustrate exemplary contactors. FIGS. 31A to 31C are cross-sections illustrating the case where a conducting film 10a is transferred to the tip 9a of the respective contactors 9 in FIGS. 30A to 30C, as illustrated in FIGS. 1 to 5.

The conducting film 10a is selectively formed on the portion of the tip 9a that contacts the electrode 31. For this reason, when the contact angles θ1 to θ3 with the wafer W differ for each contactor 9, the portion onto which the conducting film 10a is transferred may also differ for each contactor 9.

The transfer location of the conducting film 10a may not be changed for each contactor 9 using electroplating methods. However, according to the test methods illustrated in FIGS. 1 to 5, the conducting film 10a may be easily formed on the portion of the contactor 9 placed against the electrode 31.

FIG. 32 illustrates exemplary contactors. FIG. 32 is a cross-section of an electrical pathway to contactors 9.

Two contactors 9 are placed against the transfer conductor 10 of a dummy wafer 57. One of the poles of a transfer voltage V1 is coupled to one of the contactors 9 via pogo pins 85, while the other pole of the transfer voltage V1 is coupled to the other contactor 9.

A current I1 flows to each contactor 9, regardless of whether or not the stage 72 is conducting or insulating.

When cleaning the contactors 9, a cleaning voltage V2 may be applied instead of a transfer voltage V1, and a cleaning conductor 35 may be used instead of a transfer conductor 10.

The dummy wafer 57 may not be specially processed in order to apply the transfer voltage V1. For this reason, the tests illustrated in FIGS. 1 to 23C may be conducted by a known wafer prober.

Figure 33:
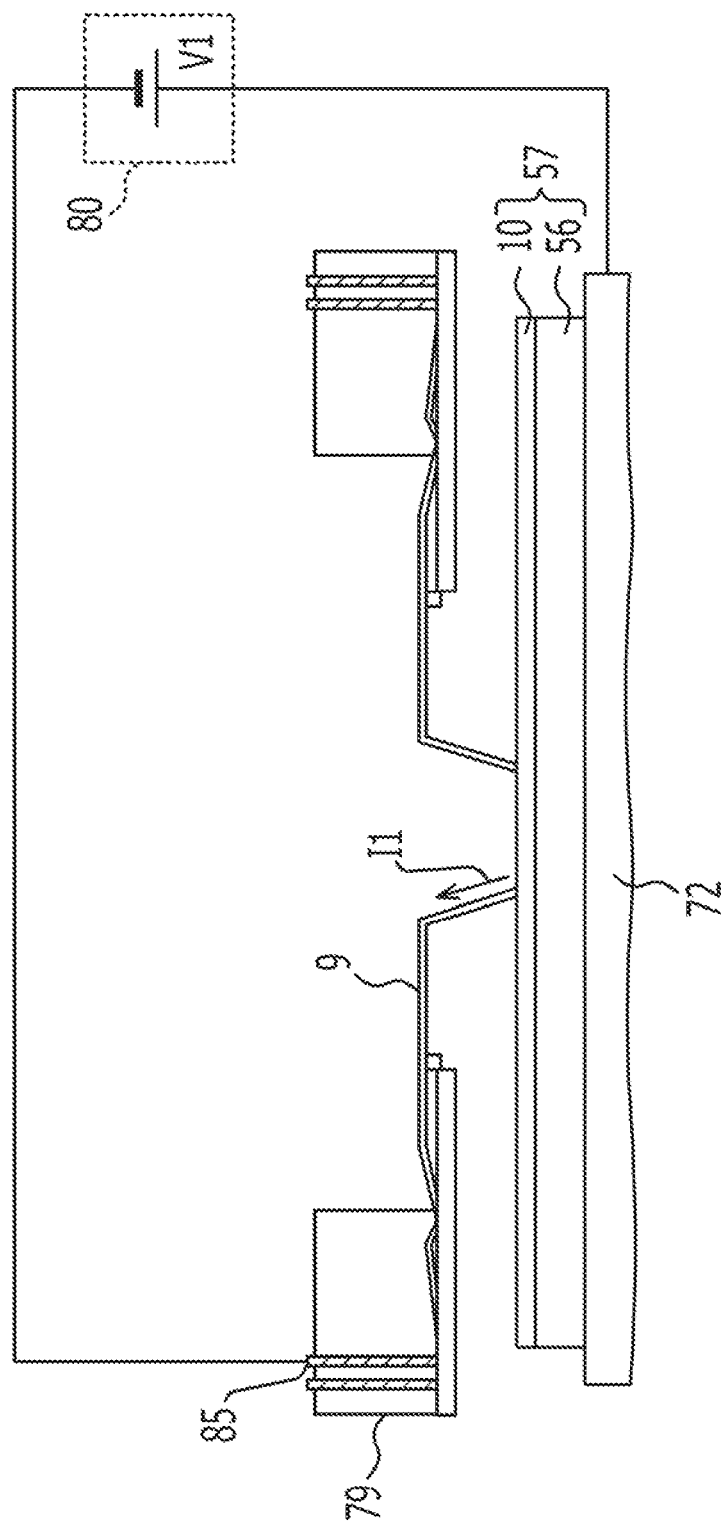
FIG. 33 illustrates an exemplary contactor.

FIG. 33 illustrates exemplary contactors. As illustrated in FIG. 33, one of the poles of the transfer voltage V1 may be coupled to the stage 72, and the other pole may be coupled to one of the contactors 9. By incorporating conducting material into the stage 72 and the stiffener 56 of the dummy wafer 57, an electrical pathway leading from the stage 72 to the contactor 9 is ensured, and a current I1 flows.

In FIG. 33, when cleaning instead of transferring a conducting film, a cleaning voltage V2 may be used instead of the transfer voltage V1, and a cleaning conductor 35 may be used instead of the transfer conductor 10.

Figure 34:
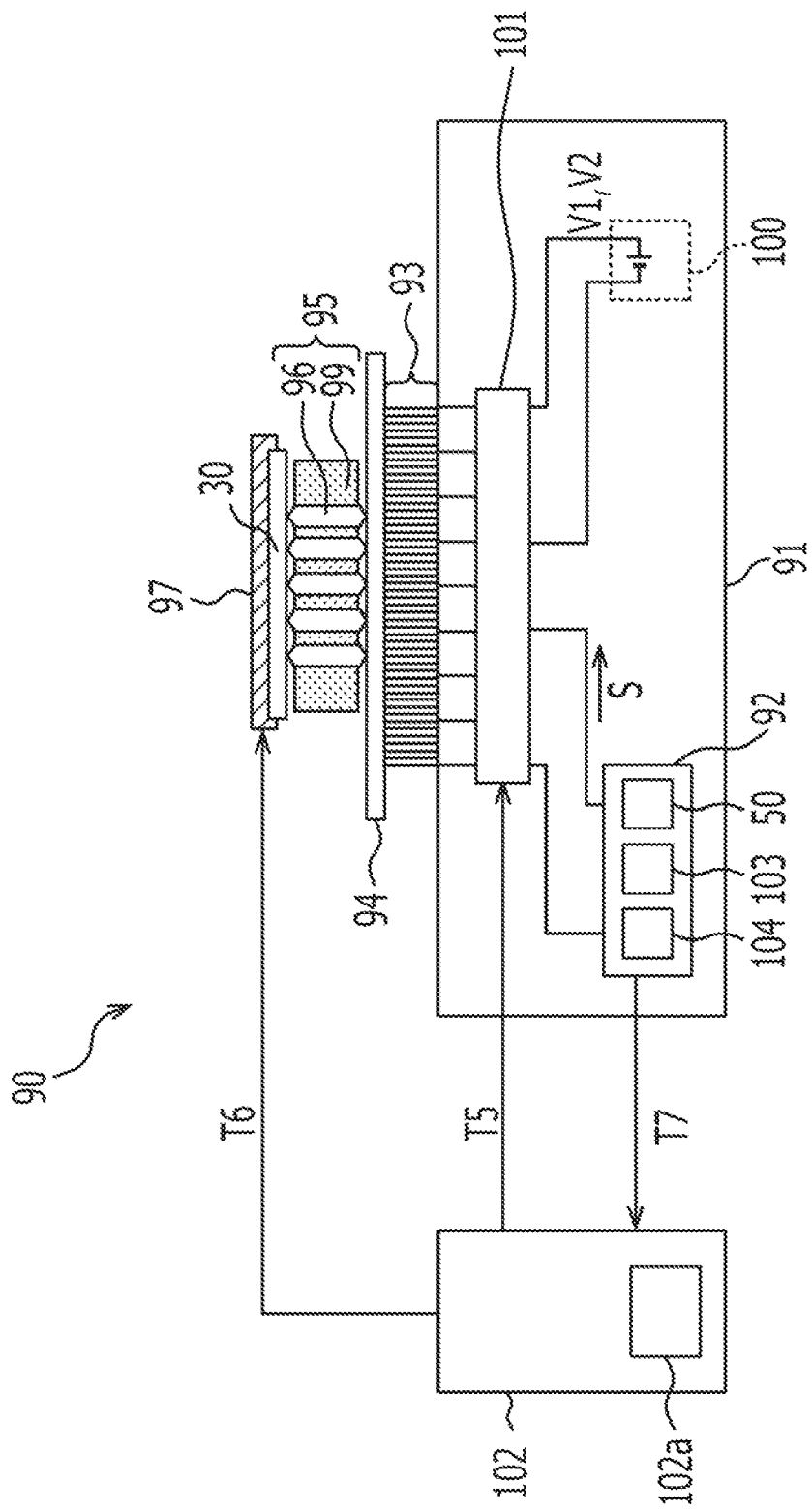
FIG. 34 illustrates an exemplary test device.

FIG. 34 illustrates one an exemplary test device. In FIG. 34, identical reference numbers are used for elements that are substantially the same as or similar to the elements illustrated in FIGS. 1 to 33, and further description of such elements may be omitted or reduced.

The test device 90 may include an IC tester, and includes a tester 91 and a controller circuit 102.

The tester 91 includes a test circuit 92, a voltage generator circuit 100, and a switching circuit 101.

The test circuit 92 includes a test signal generator circuit 103, which generates a test signal S, and a decision circuit 104, which determines whether or not the semiconductor apparatus 30 includes particular functions based on the output signal from a semiconductor apparatus 30 to be tested. A contact resistance measuring unit 50 may also be provided in the test circuit 92.

The voltage generator circuit 100 generates a transfer voltage V1 or a cleaning voltage V2, and supplies the transfer voltage V1 or the cleaning voltage V2 to the switching circuit 101. Since the voltage generator circuit 100 is provided separately from the test signal generator circuit 103, at least one of the voltages V1 and V2, which is not used for tests, may be set higher than the maximum voltage of the test signal S.

The switching circuit 101 selects one of the voltage V1 or V2 and the test signal S based on a switching signal T5 output from the controller circuit 102. The selected output is then output to the pogo pins 93.

The switching circuit 101 may include a plurality of relays in accordance with the number of pogo pins 93.

Some or all of the spring probes 96 on a socket 95 are connected to the voltage generator circuit 100 by the switching circuit 101.

A test board 94 is placed on top of the pogo pins 93. The test board 94 may be a circuit board including laminated trace patterns and insulating layers. The socket 95 is provided on the test board 94.

The socket 95 includes spring probes 96 and a resinous socket body 99. A handler 97 is provided above the socket 95, and a semiconductor apparatus 30 gripped by the handler 97 is pressed down onto the spring probes 96.

The handler 97 is controlled by a transport signal T6 output from the controller circuit 102.

The controller circuit 102 detects the contact resistance value between the spring probes 96 and the semiconductor apparatus 30 based on a resistance signal T7 output from the contact resistance measuring unit 50. For this reason, the necessity of cleaning is determined based on the contact resistance value.

The controller circuit 102 includes a program 102a that stores output timings for the signals T5 and T6. The output timings for the signals T5 and T6 are arbitrarily stored in the program 102a. Arbitrary timings may be set for transferring the conducting film 10a to the tips of the spring probes 96 or cleaning the contactors 9, and the test methods illustrated in FIGS. 3A and 3B, 10A and 10B, 14A and 14B, and 16, for example, may be executed automatically.

Figure 35:
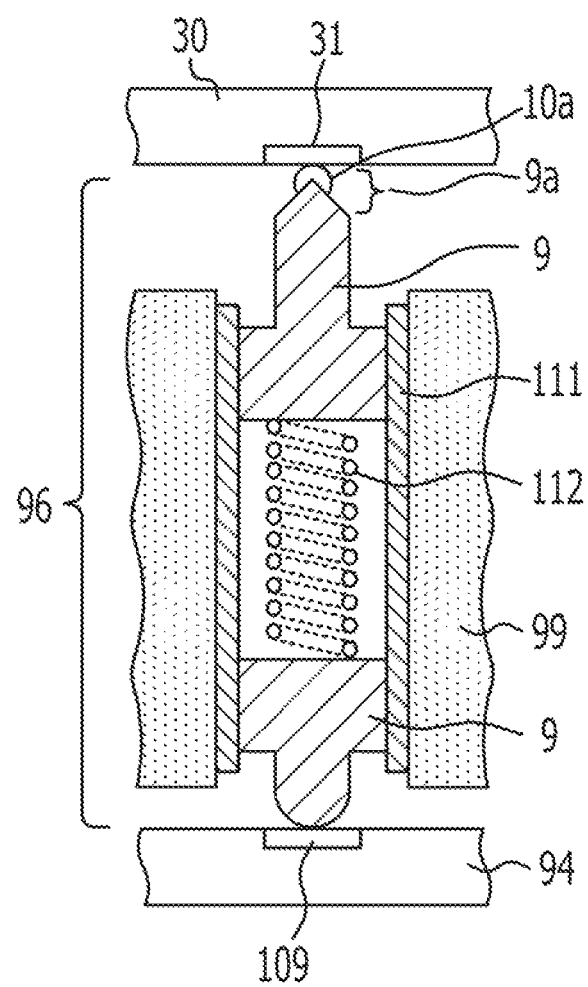
FIG. 35 illustrates an exemplary spring probe.

FIG. 35 illustrates an exemplary spring probe. FIG. 35 is an enlarged cross-section of one of the spring probes 96.

Each spring probe 96 includes a sleeve 111 including a spring 112. The sleeve 111 includes a pair of contactors 9, which function as plungers. One of the contactors 9 is placed against one of the electrodes 31 of a semiconductor apparatus 30, while the other is placed against one of the electrodes 109 of the test board 94. The respective contactors 9 are impelled away from each other by the spring 112, and are pressed against the respective electrodes 31 and 109.

The shapes of the tips 9a of the contactors 9 may be arbitrary. For example, when the surface of the electrode 31 is flat, the corresponding contactor 9 may have a conically pointed tip 9a as illustrated in FIG. 35, such that the contactor 9 reliably contacts with the electrode 31 by breaking through the native oxide on the surface of the electrode 31 during testing.

A conducting film 10a may be selectively formed on the tips 9a as illustrated in FIGS. 1 to 5 in order to protect the contactors 9 from wear during testing.

The conducting film 10a may be formed by electroplating.

As illustrated in FIGS. 1 to 5, electrical energy may be utilized to transfer a conducting film 10a to a contactor 9.

Since a conducting film 10a is formed on the tip 9a that is placed against the electrode 31, the spring probes 96 may operate normally.

Figure 36:
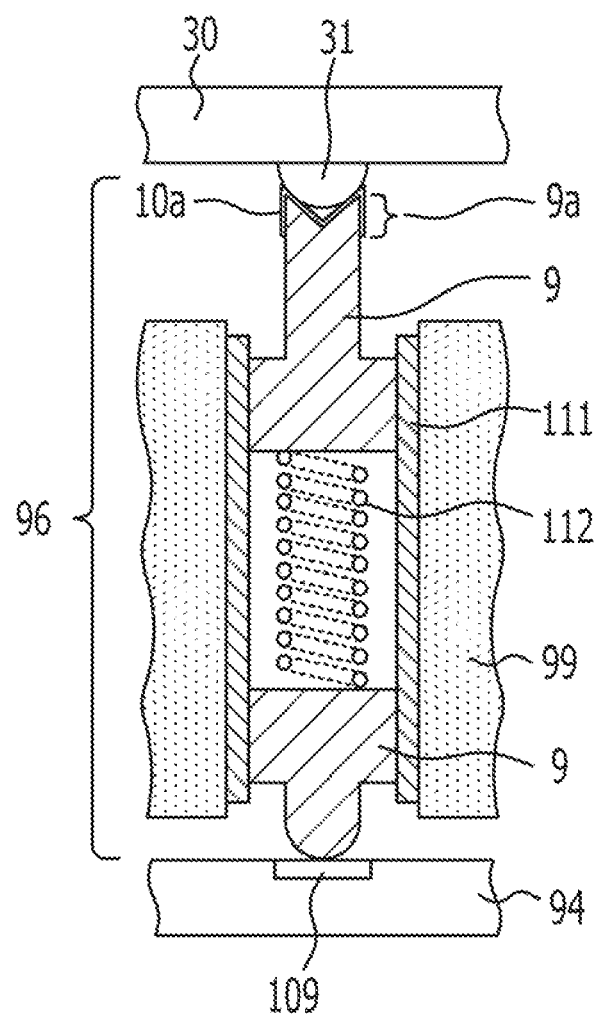
FIG. 36 illustrates an exemplary spring probe.

FIG. 36 illustrates an exemplary spring probe. FIG. 36 illustrates a cross-section of the shape of a tip 9a.

The tip 9a has a depression in its center. When the electrode 31 is a projecting electrode, such as a solder bump, the tip 9a may be placed against a plurality of points on the surface of the electrode 31. The native oxide on the surface of the electrode 31 may be broken through at the contact portion, and the contactor 9 may reliably contact with the electrode 31 electrically.

As illustrated in FIGS. 1 to 6B, a conducting film 10a is transferred to a tip 9a, and the tip 9a may be protected from wear during testing.

Figure 37:
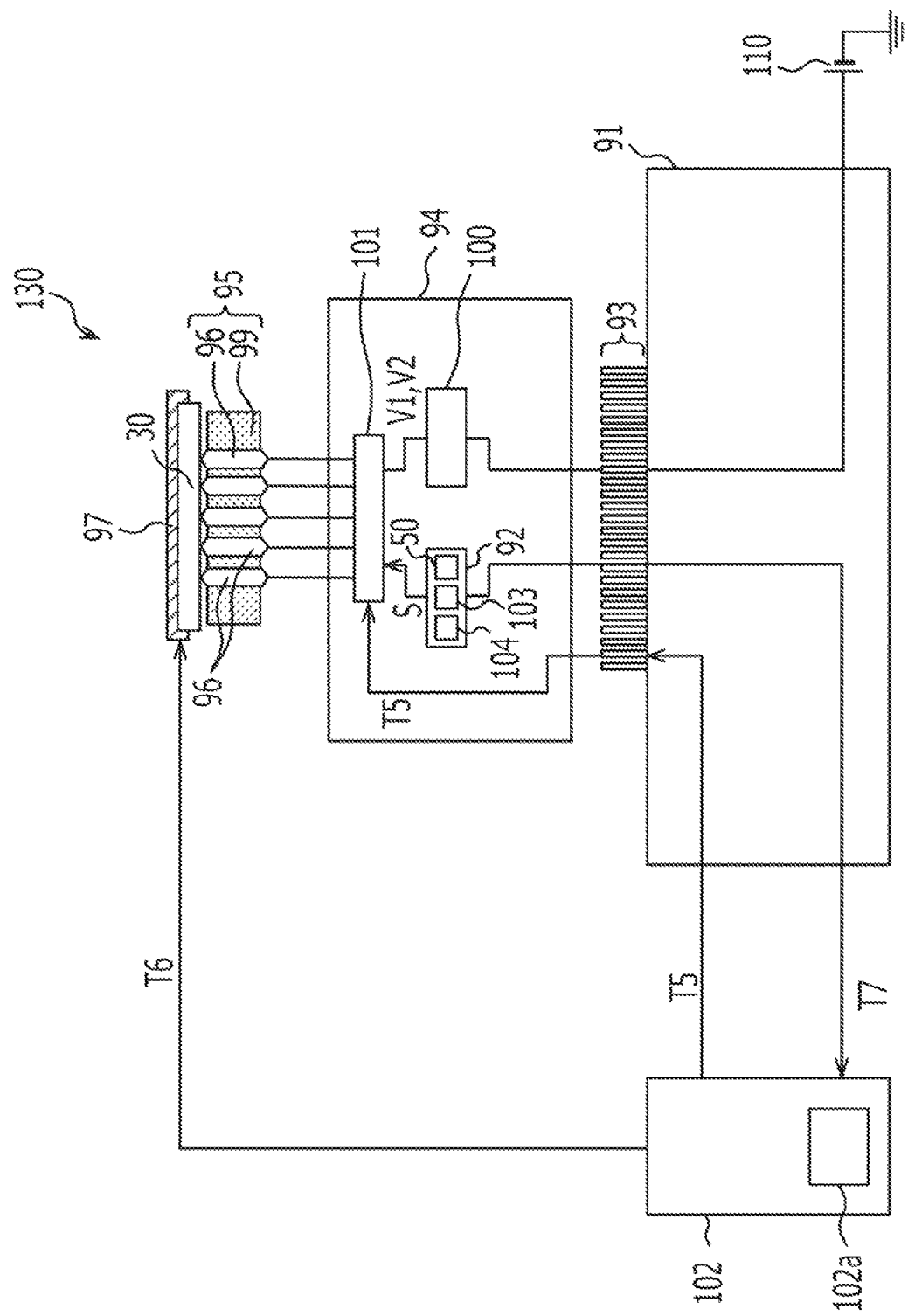
FIG. 37 illustrates an exemplary test device.

FIG. 37 illustrates an exemplary test device. In FIG. 37, identical reference numbers are used for elements that are substantially the same as or similar to the elements illustrated in FIGS. 34 to 36, and further description of such elements may be omitted or reduced.

In FIG. 37, the test board 94 is illustrated in plan view, while other elements are illustrated in cross-section.

The test board 94 includes a test circuit 92, a voltage generator circuit 100, and a switching circuit 101.

The test circuit 92 includes a contact resistance measuring unit 50, a test signal generator circuit, and a decision circuit 104, as illustrated in FIGS. 24 to 33.

The voltage generator circuit 100 may include a step-up circuit that boosts the voltage supplied from an external power supply 110 via the pogo pins 93. The voltage generator circuit 100 outputs a transfer voltage V1 or a cleaning voltage V2 to the switching circuit 101.

The switching circuit 101 includes one or more relays, for example, and selects one of the voltage V1 or V2 and a test signal S output from the test circuit 92. The selected output is output to the socket 95.

A switching signal T5 is supplied to the switching circuit 101 via the pogo pins 93, and a resistance signal T7 is supplied to the controller circuit 102 via the pogo pins 93.

The switching circuit 101 may couple all of the spring probes 96 on the socket 95 to either the voltage generator circuit 100 or the test circuit 92. By coupling all spring probes 96 to the voltage generator circuit 100 contemporaneously, a conducting film 10a may be transferred to all spring probes 96 contemporaneously, or alternatively, all spring probes 96 may be cleaned contemporaneously.

Example embodiments of the present invention have now been described in accordance with the above advantages. It will be appreciated that these examples are merely illustrative of the invention. Many variations and modifications will be apparent to those skilled in the art.

What is claimed is:

1. A contactor, comprising:
a contactor base material including a first material;
a conductor film formed at a contact surface of a tip of the contactor base material, the conductor film including a second material;
a thin film formed between the surface of the contactor base material and the conductor film, the thin film including a third material; and
a covalent bond layer formed in an interface between the conductor film and the thin film, the covalent bond layer is formed through a covalent bond of the second material and the third material,
a difference between a covalent radius of the second material and a covalent radius of the third material is less than a difference between the covalent radius of the second material and a covalent radius of the first material.

2. The contactor according to claim 1,
wherein the third material includes nickel or an alloy of nickel and gold.

3. The contactor according to claim 1, wherein the second material and the third material are substantially identical.

4. The contactor according to claim 1, wherein the second material includes gold, platinum, nickel, palladium, or palladium-cobalt alloys.

5. The contactor according to claim 4, wherein an electrode of a semiconductor apparatus to come in contact with the contact surface includes aluminum, tin, or lead.

6. The contactor according to claim 1, wherein the second material differs from the material included in an electrode of a semiconductor apparatus to come in contact with the contact surface.

7. The contactor according to claim 1, wherein the first material includes copper, iron, a beryllium copper alloy or tungsten.

* * * * *